(12) United States Patent
Minemoto et al.

(10) Patent No.: US 7,794,539 B2
(45) Date of Patent: *Sep. 14, 2010

(54) METHOD FOR PRODUCING III GROUP ELEMENT NITRIDE CRYSTAL, PRODUCTION APPARATUS FOR USE THEREIN, AND SEMICONDUCTOR ELEMENT PRODUCED THEREBY

(75) Inventors: Hisashi Minemoto, Osaka (JP); Yasuo Kitaoka, Osaka (JP); Isao Kidoguchi, Hyogo (JP); Yusuke Mori, c/o Graduate School of Engineering, Osaka University, 2-1, Yamadaoka, Suita-shi, Osaka (JP) 565-0871; Fumio Kawamura, Osaka (JP); Takatomo Sasaki, Osaka (JP); Yasuhito Takahashi, Osaka (JP)

(73) Assignees: Panasonic Corporation, Osaka (JP); Yusuke Mori, Osaka (JP)

( * ) Notice: Subject to any disclaimer, the term of this patent is extended or adjusted under 35 U.S.C. 154(b) by 950 days.

This patent is subject to a terminal disclaimer.

(21) Appl. No.: 10/599,501

(22) PCT Filed: Mar. 31, 2005

(86) PCT No.: PCT/JP2005/006365
§ 371 (c)(1),
(2), (4) Date: Sep. 29, 2006

(87) PCT Pub. No.: WO2005/095681
PCT Pub. Date: Oct. 13, 2005

(65) Prior Publication Data
US 2007/0272941 A1 Nov. 29, 2007

(30) Foreign Application Priority Data
Mar. 31, 2004 (JP) .............................. 2004-106676

(51) Int. Cl.
*C30B 9/00* (2006.01)
*C30B 30/04* (2006.01)
*C30B 28/06* (2006.01)
*C30B 11/00* (2006.01)

(52) U.S. Cl. .............................. 117/73; 117/13; 117/68; 117/74; 117/75; 117/77; 117/78; 117/223; 117/224; 117/952

(58) Field of Classification Search .................... 117/68, 117/13, 73, 74, 75, 77, 78, 223, 224, 952
See application file for complete search history.

(56) References Cited

U.S. PATENT DOCUMENTS 6,066,205 A 5/2000 Hunter
(Continued)

FOREIGN PATENT DOCUMENTS

CN 1463309 12/2003
(Continued)

OTHER PUBLICATIONS

Song, et al., "Bulk GaN single crystals: growth conditions by flux method", Journal of Crystal Growth 247 (2003) 275-278.
(Continued)

*Primary Examiner*—G. Nagesh Rao
(74) *Attorney, Agent, or Firm*—Hamre, Schumann, Mueller & Larson, P.C.

(57) ABSTRACT

A method for producing Group-III-element nitride crystals by which an improved growth rate is obtained and large high-quality crystals can be grown in a short time, a producing apparatus used therein, and a semiconductor element obtained using the method and the apparatus are provided. The method is a method for producing Group-III-element nitride crystals that includes a crystal growth process of subjecting a material solution containing a Group III element, nitrogen, and at least one of alkali metal and alkaline-earth metal to pressurizing and heating under an atmosphere of a nitrogen-containing gas so that the nitrogen and the Group III element in the material solution react with each other to grow crystals. The method further includes, prior to the crystal growth process, a material preparation process of preparing the material solution in a manner that under an atmosphere of a nitrogen-containing gas, at least one of an ambient temperature and an ambient pressure is set so as to be higher than is set as a condition for the crystal growth process so that the nitrogen is allowed to dissolve in a melt containing the Group III element and the at least one of alkali metal and alkaline-earth metal. The method according to the present invention can be performed by using, for example, the producing apparatus shown in FIG. 7.

16 Claims, 11 Drawing Sheets

U.S. PATENT DOCUMENTS

| | | | |
|---|---|---|---|
| 6,270,569 B1* | 8/2001 | Shibata et al. | 117/68 |
| 6,592,663 B1 | 7/2003 | Sarayama et al. | |
| 7,001,457 B2* | 2/2006 | Sarayama et al. | 117/74 |
| 7,255,742 B2* | 8/2007 | Kitaoka et al. | 117/81 |
| 2002/0046695 A1* | 4/2002 | Sarayama et al. | 117/84 |
| 2002/0175338 A1* | 11/2002 | Sarayama et al. | 257/95 |
| 2005/0011432 A1* | 1/2005 | Kitaoka et al. | 117/54 |
| 2006/0032428 A1* | 2/2006 | Dwilinski et al. | 117/11 |
| 2006/0037530 A1* | 2/2006 | Dwilinski et al. | 117/70 |
| 2007/0012239 A1* | 1/2007 | Sarayama et al. | 117/68 |
| 2007/0187700 A1* | 8/2007 | Kitaoka et al. | 257/79 |
| 2007/0272941 A1* | 11/2007 | Minemoto et al. | 257/103 |
| 2008/0302297 A1* | 12/2008 | Ichimura et al. | 117/73 |
| 2009/0120354 A1* | 5/2009 | Sarayama et al. | 117/203 |
| 2009/0173274 A1* | 7/2009 | Sarayama et al. | 117/68 |

FOREIGN PATENT DOCUMENTS

| | | |
|---|---|---|
| JP | 10-7496 | 1/1998 |
| JP | 11-292679 | 10/1999 |
| JP | 2000-233997 | 8/2000 |
| JP | 2001-102316 | 4/2001 |
| JP | 2002-241112 | 8/2002 |
| JP | 2002-293696 | 10/2002 |
| JP | 2003-3000798 | 10/2003 |
| WO | 02/101120 | 12/2002 |

OTHER PUBLICATIONS

Onda, et al., "Influence of pressure control on the growth of bulk GaN single crystal using a Na flux", Journal of Crystal Growth 237-239 (2002) 2112-2115.

* cited by examiner

METHOD FOR PRODUCING III GROUP ELEMENT NITRIDE CRYSTAL, PRODUCTION APPARATUS FOR USE THEREIN, AND SEMICONDUCTOR ELEMENT PRODUCED THEREBY

CROSS-REFERENCE RELATED APPLICATIONS

This application is a National Stage Entry of PCT/JP05/06365 filed Mar. 31, 2005.

TECHNICAL FIELD

The present invention relates to a method for producing Group-III-element nitride crystals, a producing apparatus used therein, and a semiconductor element obtained using the method and the apparatus.

BACKGROUND ART

Attention has been drawn to gallium nitride (GaN) as a material for semiconductor elements that emit blue or ultraviolet light. A laser diode (LD) that emits blue light is used for high-density optical disks and displays, and a light-emitting diode (LED) that emits blue light is used for displays, lighting and the like. Further, an ultraviolet LD is expected to be used in the field of biotechnology or the like, and an ultraviolet LED is expected to be used in fluorescent lamps to emit ultraviolet light.

Generally, GaN crystals that are used for LDs or LEDs are formed by heteroepitaxially growing GaN crystals on a sapphire substrate using the vapor phase epitaxial method. GaN crystals obtained in this manner generally have a dislocation density of $10^8$ $cm^{-2}$ to $10^9$ $cm^{-2}$ and thus are of inferior quality. As a solution to this problem, for example, an ELOG (epitaxial lateral overgrowth) method has been developed. By this method, the dislocation density can be reduced to about $10^5$ $cm^{-2}$ to $10^6$ $cm^{-2}$. This method, however, includes complicated processes and thus is disadvantageous.

Meanwhile, besides the vapor phase epitaxy, a method of growing crystals from a liquid phase also has been studied. However, since the equilibrium vapor pressure of nitrogen is at least 10000 atm ($10000 \times 1.013 \times 10^5$ Pa) at the melting point of GaN crystals, conventionally, conditions as harsh as 8000 atm ($8000 \times 1.013 \times 10^5$ Pa) at 1200° C. are required for growing GaN crystals from a liquid phase. In order to solve this problem, a method using a Na flux has been developed. This method allows GaN crystals to be obtained using relatively mild conditions. Moreover, there also is a method in which a mixture of Ga and Na is melted by pressurizing and heating under an atmosphere of nitrogen gas containing ammonia, and a melt thus obtained is used to grow crystals for 96 hours, so that single crystals having a maximum crystal size of about 1.2 mm are obtained (see, for example, Patent document 1).

Furthermore, a method has been proposed in which a reaction vessel and a crystal growth vessel are formed as separate units so as to suppress natural nucleus development, and thus crystals are grown to be large (see, for example, Patent document 2).

However, in the field of Group-III-element nitrides such as GaN, there has been a demand for further improvements in growth rate and quality.

Patent document 1: JP 2002-293696 A

Patent document 2: JP 2003-300798 A

DISCLOSURE OF INVENTION

Problem to be Solved by the Invention

With the foregoing in mind, it is an object of the present invention to provide a method for producing Group-III-element nitride crystals by which an improved growth rate is obtained and large high-quality crystals can be grown in a short time, a producing apparatus used therein, and a semiconductor element obtained using the method and the apparatus.

Means for Solving Problem

In order to achieve the above-mentioned object, a producing method according to the present invention is a method for producing Group-III-element nitride crystals that includes a crystal growth process of subjecting a material solution containing a Group III element, nitrogen, and at least one of alkali metal and alkaline-earth metal to pressurizing and heating under an atmosphere of a nitrogen-containing gas so that the nitrogen and the Group III element in the material solution react with each other to grow crystals. The method further includes, prior to the crystal growth process, a material preparation process of preparing the material solution in a manner that under an atmosphere of a nitrogen-containing gas, at least one of an ambient temperature and an ambient pressure is set so as to be higher than is set as a condition for the crystal growth process so that the nitrogen is allowed to dissolve in a melt containing the Group III element and the at least one of alkali metal and alkaline-earth metal.

A producing apparatus according to the present invention is an apparatus for producing Group-III-element nitride crystals that includes a heater, a pressurizer, nitrogen-containing gas supplying means, a crystal growth vessel, a material preparation vessel, and material conveying means. In the apparatus, the crystal growth vessel and the material preparation vessel are connected to each other via the material conveying means, and in each of the crystal growth vessel and the material preparation vessel, the heater, the pressurizer, and the nitrogen-containing gas supplying means are disposed. In the material preparation vessel, using the heater, the pressurizer, and the nitrogen-containing gas supplying means, under an atmosphere of a nitrogen-containing gas, pressurizing and heating are performed so that a melt containing a Group III element and at least one of alkali metal and alkaline-earth metal is prepared, and nitrogen is allowed to dissolve in the melt so that a material solution is prepared. The material solution is conveyed from the material preparation vessel to the crystal growth vessel by means of the material conveying means. In the crystal growth vessel, using the heater, the pressurizer, and the nitrogen-containing gas supplying means, under an atmosphere of a nitrogen-containing gas, pressurizing and heating are performed so that the nitrogen and the Group III element in the material solution react with each other to grow Group-III-element nitride crystals.

Further, in the material preparation vessel, at least one of an ambient temperature and an ambient pressure is set so as to be higher than in the crystal growth vessel.

Effects of the Invention

The inventors of the present invention conducted a series of studies on the growth of Group-III-element nitride crystals. In the course of the studies, it was found that in the case of a conventional method, in an early stage of crystal growth, there is a long period of time in which crystals do not grow at all, and this time period in the early stage making no contribution to the crystal growth is rather long, for example, about 24 hours to 48 hours, constituting about 20% to 50% of an entire growth time, though it may vary depending on conditions for the crystal growth. Due to the above-described time period making no contribution to the crystal growth, the length of time in which substantial crystal growth is performed is reduced, and as a result, an apparent crystal growth rate determined by dividing a thickness of a grown crystal by a length of a growth time (including a time period making no contribution to growth) is decreased. That is, when growing crystals in an effort to obtain large crystals or crystals with a large thickness, the length of time required to obtain crystals of a desired size is increased. In the course of further studies, the inventors of the present invention found that in order to avoid having, in an early stage of crystal growth, a time period in which crystals do not grow at all, a sufficient length of time is required for nitrogen to dissolve in a melt containing a Group III element. As a result of still further studies based on this finding, the inventors arrived at the present invention. That is, prior to crystal growth, a material solution is prepared in a manner that at least one of an ambient temperature and an ambient pressure is preset so as to be higher than is set as a condition for crystal growth so that nitrogen is forced to dissolve in a melt containing a Group III element and at least one of alkali metal and alkaline-earth metal (material preparation process: in this state, Group-III-element nitride crystals in the melt (material solution) are in a saturated or unsaturated state). After that, for example, the temperature of the material solution is lowered to a desired temperature so that the Group-III-element nitride crystals in the melt are shifted from the saturated or unsaturated state to a supersaturated state, and thus crystal growth is performed at a desired ambient temperature and a desired ambient pressure (crystal growth process: in this state, the Group-III-element nitride crystals in the melt are in the supersaturated state). Alternatively, after the material preparation process, the ambient pressure is lowered to a desired pressure so that crystal growth is performed. By performing the material preparation process in the above-described manner, compared with the conventional method in which from a step of allowing nitrogen to dissolve in a melt, an ambient temperature and an ambient pressure are kept at values that are set as conditions for crystal growth, a length of time required to attain a supersaturated state can be reduced. Thus, according to the present invention, crystal growth of Group-III-element nitride crystals can be started in a state where a time period making no contribution to a growth time is reduced or almost eliminated. In the case where an ambient pressure is lowered to a desired pressure, immediately thereafter, Group-III-element nitride crystals in a melt are in a saturated or unsaturated state. However, due to the ambient pressure being kept at the desired pressure for a fixed length of time, nitrogen further dissolves in the melt (material solution), so that the Group-III-element nitride crystals in the melt are brought to a supersaturated state to start crystal growth. In the material preparation process, by utilizing any of, for example, an ambient temperature, an ambient pressure, gas supplying methods (for example, a gas flow and bubbling), and ultrasonic waves, a length of time required for nitrogen to dissolve in a melt can be reduced further. Further, in the crystal growth process, by, for example, keeping an ambient pressure and an ambient temperature constant or varying them mildly during a time of crystal growth, for example, even in the case where Group-III-element nitride crystals are grown three-dimensionally, a constant crystal growth rate can be obtained. As a result, for example, crystals can be grown in a shorter time, and the obtained crystals have a reduced variation in the concentration of impurities or the like and thus are of high quality.

EXPLANATION OF LETTERS OR NUMERALS

Figure 1:
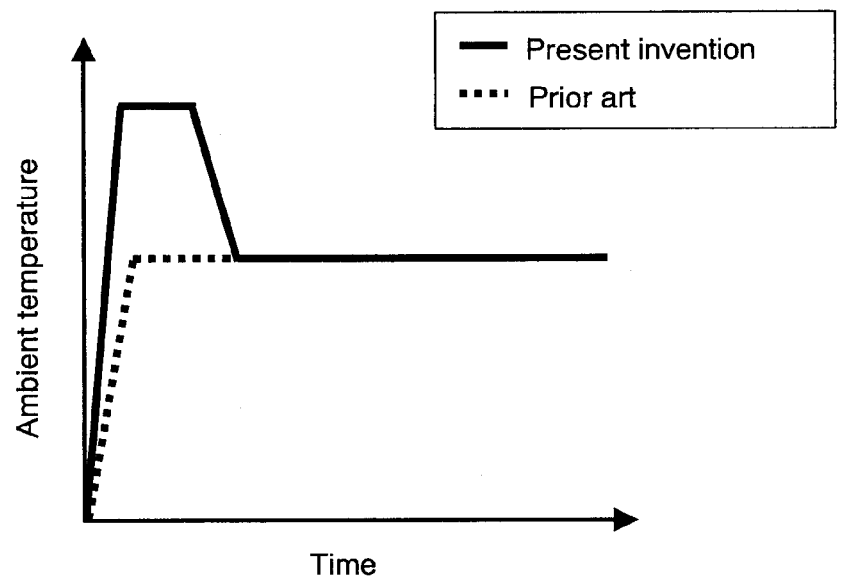
FIG. 1 is a graph showing a relationship between time and ambient temperature in an embodiment according to the present invention.

11 Reaction vessel
12 Material preparation vessel
13 Material solution reservoir
14 Crystal growth vessel
15 Material preparation vessel-cum-crystal growth vessel
16 Material conveying means
17 Pipe
20,21 Gas supplying device
22 Flow amount adjuster
23 Gas introducing tube
24,26 Pressure adjuster
27 Cap
28 Heat blocking plates
29 Ultrasonic wave generating device
30,34 Heater
42,48,49 Hole
43 Partition
44 Lid
45 Seed crystals
46 Crystal growth vessel portion
47 Material preparation vessel portion
50 First pressure vessel
51,53 Pressure vessel
52 Second pressure vessel
72 Driving means
74 Stirring means
76 Rotation introducing means
90 Semiconductor laser
91 Substrate
92 Contact layer
93 Cladding layer
94,96 Light guiding layer
95 Multiple quantum well layer
97 Cladding layer
98 Contact layer
99 Insulating film
100 P-side electrode
101 N-side electrode
A Material conveying direction
B Gas supplying direction

DESCRIPTION OF THE INVENTION

As described above, the producing method according to the present invention includes the material preparation process and the crystal growth process. In the material preparation process, a material solution is prepared in a manner that at least one of an ambient temperature and an ambient pressure is set so as to be higher than is set as a condition for the crystal growth process so that nitrogen is allowed to dissolve in the melt (in this state, Group-III-element nitride crystals in the melt (material solution) are in a saturated or unsaturated state). Then, at least one of the ambient temperature and the ambient pressure is lowered once so that the Group-III-element nitride crystals in the material solution are brought to a supersaturated state, thereby growing the Group-III-element nitride crystals in the material solution. In the case where only the ambient temperature is lowered, the Group-III-element nitride crystals in the material solution can be brought to a supersaturated state swiftly by this operation alone. Thus, crystal growth can be started with a time period making no contribution to the crystal growth reduced considerably. In the case where only the ambient pressure is lowered, the Group-III-element nitride crystals in the material solution immediately thereafter are in a saturated or unsaturated state. However, due to this pressure being kept for a fixed length of time, the nitrogen further dissolves in the material solution to bring about a supersaturated state, so that crystal growth is started. Thus, the crystal growth can be started with a reduced time period that makes no contribution to the crystal growth. In this case, compared with the case where only the ambient temperature is lowered, crystal growth can be performed at a high ambient temperature, and as a result, crystals can be grown under a condition taking in hardly any impurities. Further, it also is possible that the ambient pressure and the ambient temperature are lowered concurrently so that the Group-III-element nitride crystals in the material solution are brought to a supersaturated state, thereby growing the crystals.

In the present invention, the ambient temperature used in the material preparation process is, for example, in a range of 800° C. to 1100° C. and preferably 850° C. to 1000° C. With the ambient temperature set so as to be in such a range, the evaporation of alkali metal and alkaline-earth metal can be suppressed, and Group-III-element nitride crystals can be dissolved efficiently. The ambient temperature used in the crystal growth process is, for example, in a range of 600° C. to 1000° C. and preferably 800° C. to 950° C. Further, a difference between the ambient temperature used in the material preparation process and the ambient temperature used in the crystal growth process is, for example, 20° C. to 200° C. and preferably 50° C. to 100° C.

In the present invention, the ambient pressure used in the material preparation process is, for example, in a range of 2 atm to 100 atm ($2 \times 1.013 \times 10^5$ Pa to $100 \times 1.013 \times 10^5$ Pa) and preferably 10 atm to 70 atm ($10 \times 1.013 \times 10^5$ Pa to $70 \times 1.013 \times 10^5$ Pa). With the ambient pressure set so as to be in this range, evaporation of alkali metal and alkaline-earth metal can be suppressed, and Group-III-element nitride crystals can be dissolved efficiently using a relatively inexpensive pressure vessel. The ambient pressure used in the crystal growth process is, for example, in a range of 2 atm to 100 atm ($2 \times 1.013 \times 10^5$ Pa to $100 \times 1.013 \times 10^5$ Pa) and preferably 25 atm to 50 atm ($25 \times 1.013 \times 10^5$ Pa to $50 \times 1.013 \times 10^5$ Pa). Further, the difference between the ambient pressure used in the material preparation process and the ambient pressure used in the crystal growth process is, for example, 0.1 atm to 30 atm ($0.1 \times 1.013 \times 10^5$ Pa to $30 \times 1.013 \times 10^5$ Pa) and preferably 0.5 atm to 20 atm ($0.5 \times 1.013 \times 10^5$ Pa to $20 \times 1.013 \times 10^5$ Pa).

In the present invention, preferably, in the case where the ambient temperature is varied in the crystal growth process, after a shift from the material preparation process to the crystal growth process, the ambient temperature used in the crystal growth process is lowered gradually so as to be set to a predetermined temperature for crystal growth. The ambient temperature may be lowered, for example, in a continuous or stepwise manner. Further, the ambient temperature can be lowered in a stepwise manner by, for example, a method in which the ambient temperature is lowered once, then is kept at the lowered temperature for a fixed length of time, again is lowered, and this whole procedure is repeated, or a method in which the ambient temperature is lowered at a varying rate. In the case where the ambient temperature is lowered at a varying rate, the rate may be varied in two or more steps. The ambient temperature is lowered at a rate of, for example, 0.05° C. per hour to 30° C. per hour, preferably 0.1° C. per hour to 5° C. per hour, and more preferably 0.1° C. per hour to 1° C. per hour.

In the present invention, preferably, in the case where the ambient pressure is varied in the crystal growth process, after a shift from the material preparation process to the crystal growth process, the ambient pressure used in the crystal growth process is raised gradually so as to be set to a predetermined pressure for crystal growth. The ambient pressure may be raised, for example, in a continuous or stepwise manner. Further, the ambient pressure can be raised in a stepwise manner by, for example, a method in which the ambient pressure is raised once, then is kept at the raised temperature for a fixed length of time, again is raised, and this whole procedure is repeated, or a method in which the ambient pressure is raised at a varying rate. In the case where the ambient pressure is raised at a varying rate, the rate may be varied in two or more steps. Further, the operation of lowering the ambient temperature and the operation of raising the ambient pressure may be performed independently or concurrently. The ambient pressure is raised at a rate of, for example, 0.01 atm per hour to 0.3 atm per hour ($0.01 \times 1.013 \times 10^5$ Pa per hour to $0.3 \times 1.013 \times 10^5$ Pa per hour) and preferably 0.05 atm per hour to 0.1 atm per hour ($0.05 \times 1.013 \times 10^5$ Pa per hour to $0.1 \times 1.013 \times 10^5$ Pa per hour).

By gradually lowering the ambient temperature or gradually raising the ambient pressure during a time of crystal growth as described above, a substantial crystal growth rate can be increased further. Further, by concurrently performing both of these operations, the crystal growth rate still further can be increased. In the present invention, a substantial crystal growth rate is, for example, 5 μm per hour to 100 μm per hour and preferably 10 μm per hour to 50 μm per hour. In the present invention, the substantial crystal growth rate refers to an hourly increase in thickness of a crystal in a time period from an actual start of crystal growth to an end thereof (excluding a time period making no contribution to the crystal growth).

In the crystal growth process, the operation of lowering the ambient temperature and the operation of raising the ambient pressure may be performed at a constant or varying rate. For example, in a mid to late stage of crystal growth, the operation of lowering the ambient temperature and the operation of raising the ambient pressure may be performed at a gradually increasing rate. By varying the rate in this manner, even in the case where crystals are grown in shape three-dimensionally, it becomes possible to keep a crystal growth rate in a direction of a certain axis (C axis, for example) substantially constant (i.e. the degree of supersaturation of the Group-III-element nitride crystals in the melt substantially constant) so that crystal quality at a starting time of the crystal growth can be retained in the late stage of the crystal growth. In the case where the ambient temperature is varied, preferably, for example, the ambient temperature is lowered first at a rate of 0.05° C. per hour in an early stage of crystal growth and is lowered at a rate of 3° C. per hour in a late stage of the crystal growth, and more preferably, the ambient temperature is lowered at a rate of 0.1° C. per hour in an early stage of crystal growth and is lowered at a rate of 1° C. per hour in a late stage of the crystal growth. Further, in the case where the ambient pressure is varied, preferably, for example, the ambient pressure is raised at a rate of 0.01 atm per hour ($0.01 \times 1.013 \times 10^5$ Pa per hour) in an early stage of crystal growth and is raised at a rate of 0.3 atm per hour ($0.3 \times 1.013 \times 10^5$ Pa per hour) in a late stage of the crystal growth, and more preferably, the ambient pressure is raised at a rate of 0.05 atm per hour ($0.05 \times 1.013 \times 10^5$ Pa per hour) in an early stage of crystal growth and is raised at a rate of 0.1 atm per hour ($0.1 \times 1.013 \times 10^5$ Pa per hour) in a late stage of the crystal growth.

In the present invention, preferably, in the material preparation process, the material solution is brought to a state where the Group-III-element nitride crystals are saturated or unsaturated. The unsaturated state refers to a state where Group-III-element nitride crystals still can be dissolved in a material solution. The solubility of a Group-III-element nitride in the material solution is, for example, 0.01 at. % to 5 at. % and preferably 0.2 at. % to 1 at. %, and a nitrogen concentration in the material solution is, for example, 0.01 at. % to 5 at. % and preferably 0.2 at. % to 1 at. %.

In the present invention, preferably, in the material preparation process, in order to supply a nitrogen-containing gas, the nitrogen-containing gas is allowed to flow over a liquid surface of the melt (material solution). A flow can be performed, for example, in a manner that the nitrogen-containing gas is supplied onto a liquid surface of a melt. Further, a flow amount of a nitrogen-containing gas to be allowed to flow can be controlled using, for example, a mass flow controller or a flowmeter.

In the present invention, preferably, in the material preparation process, in order to supply a nitrogen-containing gas, the nitrogen-containing gas is bubbled in the melt. This is preferable because bubbling increases an area of a gas-liquid interface where a melt and a nitrogen-containing gas come into contact with each other, and thus efficiency of nitrogen dissolution in the melt further can be improved. Moreover, by convection caused by bubbling, for example, a nitrogen concentration in a melt can be made uniform. Bubbling can be performed by, for example, in a manner that a nitrogen-containing gas is supplied directly into a melt. Similarly to the case of allowing a nitrogen-containing gas to flow, a flow amount of a nitrogen-containing gas to be bubbled can be controlled using, for example, a mass flow controller or a flowmeter. Preferably, bubbles to be supplied by the bubbling are as small as possible, though there is no particular limitation on the size of the bubbles. For example, the size of the bubbles is microbubbles (having a diameter of not more than 100 μm, for example) and nanobubbles (having a diameter of not more than 100 nm, for example), preferably. By using such small bubbles, an area of a gas-liquid interface where a melt and a nitrogen-containing gas come in contact with each other further is increased, thereby improving the efficiency of nitrogen dissolution in the melt, and evaporation of alkali metal or the like in the melt can be suppressed. Further, preferably, in addition to performing the bubbling, ultrasonic waves are applied to the melt. This allows bubbles of a nitrogen-containing gas supplied by the bubbling to be fixed, for example, at a position of a node of ultrasonic waves, so that the bubbles can stay in a melt for a still longer time and further can be reduced in diameter, and thus the efficiency of nitrogen dissolution further can be improved. For example, JP 10(1998)-7496 A and U.S. Pat. No. 6,066,205 disclose methods for obtaining Group-III-element nitride crystals by bubbling, for example, ammonia gas in a melt containing a Group III element. However, in each of these methods, a nitrogen-containing gas is bubbled in a melt in which Group-III-element nitride crystals are in a supersaturated state, so that heterogeneous nuclei are generated or taken into a grown crystal as impurities, which are problematic. On the other hand, in the present invention, a nitrogen-containing gas is bubbled in a melt in which Group-III-element nitride crystals are in a saturated or unsaturated state, and thus the above-described effects are obtained without causing such problems.

In the present invention, preferably, in order that crystal growth is performed continually, the material preparation process is performed, for example, at least during or after the crystal growth process as well as before the crystal growth process or concurrently with the crystal growth process. For example, the crystal growth process may be performed in a manner that another melt in which nitrogen is dissolved (material solution) is prepared and added appropriately. Further, by continually performing the material preparation process also at a time of taking out crystals, a time of placing crystals and the like, crystal growth can be performed continually in a later process, thereby achieving a further improvement in producing efficiency.

In the present invention, examples of the alkali metal include sodium (Na), lithium (Li), potassium (K), rubidium (Rb), and cesium (Cs), and among these, sodium (Na) is used preferably. These alkali metals may be used alone or in combinations of two or more kinds. Examples of the alkaline-earth metal include calcium (Ca), magnesium (Mg), beryllium (Be), strontium (Sr), and barium (Ba). It is preferable to use calcium (Ca), strontium (Sr), or barium (Ba), and it is more preferable to use calcium (Ca). These alkaline-earth metals may be used alone or in combinations of two or more kinds. In the present invention, it is assumed that the alkaline-earth metal includes calcium (Ca), magnesium (Mg), beryllium (Be), strontium (Sr), and barium (Ba). In the present invention, the melt may contain as dopants, n-type and p-type dopants such as, for example, silicon (Si), zinc (Zn), and magnesium (Mg).

In the present invention, preferably, the Group III element is any of Al, Ga, and In, and more preferably, among these, Ga is used to produce GaN crystals.

In the present invention, a nitrogen source of the nitrogen contained in the material solution is not particularly limited and may be, for example, a nitrogen-containing gas or a nitrogen compound mixed in a material solution. Examples of the nitrogen-containing gas (reactive gas) include nitrogen ($N_2$) gas and ammonia ($NH_3$) gas, and these gases may be used alone or in combination. The nitrogen-containing gas (reactive gas) may include, for example, inert gases (for example, Ar, He, and Ne) and hydrogen gas. As a source of the nitrogen-containing gas (reactive gas), hydrazine ($H_2NNH_2$) may be used, or alternatively, hydrazine is mixed in the melt and an obtained mixture may be used as a nitrogen source. In the case where hydrazine is used as a nitrogen-containing gas (reactive gas) source, in view of the fact that hydrazine is decomposed into ammonia and nitrogen at 180° C. in the air, for example, a gas obtained by heating hydrazine may be supplied in that state as a nitrogen-containing gas or may be diluted with any of nitrogen ($N_2$) gas, the inert gases and the like as a carrier gas so as to be supplied. Further, in the present invention, a pressure gas for applying pressure may be supplied apart from the reactive gas. Examples of the pressure gas used in this case include the above-mentioned inert gases. The pressure gas may be supplied in combination with the reactive gas or independently through another system.

In the present invention, preferably, in the crystal growth process, a crystal growth reaction is performed in a crystal growth vessel, and in the material preparation process, the material solution is prepared in a material preparation vessel in a manner that the nitrogen is allowed to dissolve in the melt containing the Group III element and the at least one of alkali metal and alkaline-earth metal, and then the material solution is conveyed from the material preparation vessel to the crystal growth vessel so that crystal growth is performed in the crystal growth vessel. The material preparation vessel and the crystal growth vessel may be formed as separate units or as one unit. In an example of the case where these vessels are formed as one unit, a single reaction vessel has a material preparation vessel portion and a crystal growth vessel portion that communicate with each other, so that a material solution in the material preparation vessel portion can be conveyed to the crystal growth vessel portion. This configuration allows a material solution to be conveyed more easily. In the case where the material preparation vessel and the crystal growth vessel formed as separate units are disposed in different pressure vessels, a material can be prepared even before and after crystal growth (for example, at a time of taking out crystals, a time of placing crystals and the like), thereby achieving a further improvement in production efficiency. In this case, although the number of the material preparation vessel is not particularly limited and may be one or more, preferably, a plurality of material preparation vessels are used. Further, in the case where a plurality of material preparation vessels are used, preferably, a material solution obtained by allowing nitrogen to dissolve in each of the plurality of material preparation vessels is collected once in another vessel via a pipe or the like and then is conveyed to a crystal growth vessel. There is no particular limitation to a material used for the material preparation vessel and the crystal growth vessel. For example, BN, AlN, alumina, SiC, and carbon materials such as graphite and diamond-like carbon can be used as the material, and among these, alumina is used preferably.

Next, as described above, the producing apparatus according to the present invention is an apparatus for producing Group-III-element nitride crystals that includes a heater, a pressurizer, nitrogen-containing gas supplying means, a crystal growth vessel, a material preparation vessel, and material conveying means. In the apparatus, the crystal growth vessel and the material preparation vessel are connected to each other via the material conveying means, and in each of the crystal growth vessel and the material preparation vessel, the heater, the pressurizer, and the nitrogen-containing gas supplying means are disposed. In the material preparation vessel, using the heater, the pressurizer, and the nitrogen-containing gas supplying means, under an atmosphere of a nitrogen-containing gas, with at least one of an ambient temperature and an ambient pressure set so as to be higher than in the crystal growth vessel, pressurizing and heating are performed so that a melt containing a Group III element and at least one of alkali metal and alkaline-earth metal is prepared, and nitrogen is allowed to dissolve in the melt so that a material solution is prepared. The material solution is conveyed from the material preparation vessel to the crystal growth vessel by means of the material conveying means. In the crystal growth vessel, using the heater, the pressurizer, and the nitrogen-containing gas supplying means, pressurizing and heating are performed under an atmosphere of a nitrogen-containing gas so that the nitrogen and the Group III element in the material solution react with each other to grow Group-III-element nitride crystals. Patent document 2 (JP 2003-300798 A) mentioned above describes an apparatus in which a crystal growth region and a mixed melt retaining region are provided separately, in the mixed melt retaining region, a mixed melt of a Group III element and alkali metal is formed under an atmosphere of an inert gas, and in the crystal growth region, Group-III-element nitride crystals are produced from the mixed melt under an atmosphere of nitrogen. The mixed melt retaining region is under the atmosphere of an inert gas, which does not contain a nitrogen-containing gas, and thus an obtained mixed melt does not contain nitrogen. Therefore, in the case of using the apparatus according to this document, in the crystal growth region, Group-III-element nitride crystals are grown after nitrogen is allowed to dissolve in the mixed melt, which means that there is a long period of time in which the crystals do not grow in the crystal growth region. On the other hand, according to the producing apparatus of the present invention, nitrogen is allowed to dissolve in a melt in the material preparation vessel, and the melt is conveyed to the crystal growth vessel by means of the material conveying means, and thus a time period making no contribution to crystal growth in the crystal growth vessel can be reduced remarkably. As a result, an apparent crystal growth rate can be increased further.

In the case where the material preparation vessel and the crystal growth vessel are formed as separate units, as an example, a first pressure vessel and a second pressure vessel are provided, the crystal growth vessel is disposed in the first pressure vessel, and the material preparation vessel is disposed in the second pressure vessel. By disposing the crystal growth vessel and the material preparation vessel in different pressure vessels as described above, it becomes possible to prepare a material even before and after crystal growth (for example, at a time of taking out crystals, a time of placing crystals and the like), which not only reduces a time period making no contribution to the crystal growth but also achieves a further improvement in production efficiency.

In the producing apparatus according to the present invention, as the heater, for example, a resistance heater or an RF heater can be used, and the pressurizer is, for example, means for applying pressure using a nitrogen-containing gas. Further, in the case where, for example, $N_2$ gas alone is used as the nitrogen-containing gas (reactive gas) and a pressure gas, a gas purifying device may be disposed in a gas system. Preferably, in the above-described apparatus, at least one of temperature adjusting means and pressure adjusting means further is provided. By the use of these means, for example, the heater or the pressurizer is controlled so that a temperature and a pressure in each of the material preparation vessel and the crystal growth vessel can be controlled.

In the producing apparatus according to the present invention, a melt in which nitrogen is dissolved (material solution) is conveyed from the material preparation vessel to the crystal growth vessel by means of the material conveying means by, for example, the following methods. That is, an ambient pressure in the second pressure vessel is set so as to be slightly higher than an ambient pressure in the first pressure vessel. Or alternatively, the melt is conveyed using a pump. As the material conveying means, for example, a pipe made of a metal such as W or Ta or a pipe with an inner wall coated with BN, SiC or the like can be used. The generation of heterogeneous nuclei also can be prevented when a material is conveyed by a method in which Group-III-element nitride crystals in a material solution is brought to a saturated or unsaturated state in the material conveying means.

Preferably, the producing apparatus according to the present invention further includes gas flow means. This allows the nitrogen-containing gas to flow over a liquid surface of a melt in the material preparation vessel, and thus a rate of nitrogen dissolution in the melt can be improved further. As the gas flow means, for example, means for supplying the nitrogen-containing gas onto a liquid surface of the melt is used.

In the producing apparatus according to the present invention, although the number of the material preparation vessel is not particularly limited and may be one or more, preferably, a plurality of material preparation vessels are used. This can increase an area of a gas-liquid interface where a melt in the material preparation vessel and the nitrogen-containing gas come into contact with each other. Further, in the case where a plurality of material preparation vessels are used, preferably, for example, a vessel such as a material reservoir is provided, and a material solution obtained by allowing nitrogen to dissolve in each of the plurality of material preparation vessels is collected once in the material reservoir via a pipe or the like and is conveyed to the crystal growth vessel. There is no particular limitation to a material used for the material preparation vessel, the crystal growth vessel, and the material reservoir. For example, BN, AlN, alumina, SiC, and carbon materials such as graphite and diamond-like carbon can be used as the material, and among these, alumina is used preferably.

In the producing apparatus according to the present invention, in addition to or instead of the gas flow means, gas bubbling means is provided. This allows the nitrogen-containing gas to be bubbled in a melt in the material preparation vessel, and thus a rate of nitrogen dissolution in the melt can be improved further. As the gas bubbling means, for example, means for supplying a nitrogen-containing gas into a melt is used. The above-described configuration is preferable because by bubbling, an area of a gas-liquid interface where a melt and a nitrogen-containing gas come into contact with each other can be increased, and thus efficiency of nitrogen dissolution into the melt further can be improved, and moreover, by convection caused by the bubbling, for example, a nitrogen concentration in the melt can be made uniform. Bubbling can be performed by, for example, in a manner that a nitrogen-containing gas is supplied into a melt. Similarly to the case of allowing a nitrogen-containing gas to flow, a flow amount of a nitrogen-containing gas to be bubbled can be controlled using, for example, a mass flow controller or a flowmeter. Preferably, bubbles to be supplied by the bubbling are as small as possible, though there is no particular limitation to the size of the bubbles. For example, the size of the bubbles is microbubbles (having a diameter of not more than 100 μm, for example) and nanobubbles (having a diameter of not more than 100 nm, for example), preferably. By using such small bubbles, an area of a gas-liquid interface where a melt and a nitrogen-containing gas come in contact with each other is increased, thereby improving the efficiency of nitrogen dissolution in the melt, and evaporation of alkali metal or the like in the melt can be suppressed. Further, preferably, in addition to performing the bubbling, ultrasonic waves are applied to the melt. This allows bubbles of a nitrogen-containing gas supplied by the bubbling to be fixed, for example, at a position of a node of ultrasonic waves, and thus the bubbles can stay in a melt for a longer time and further can be reduced in diameter, and thus the efficiency of nitrogen dissolution can be improved further.

A semiconductor element according to the present invention includes the crystals obtained by the above-described producing method.

Preferably, the semiconductor element is, for example, a light-emitting device such as a LED or a semiconductor laser, or an electronic device such as a power device or a high-frequency amplifier.

Hereinafter, the producing method and the apparatus according to the present invention will be described by way of the following embodiments.

EMBODIMENT 1

Figure 7:
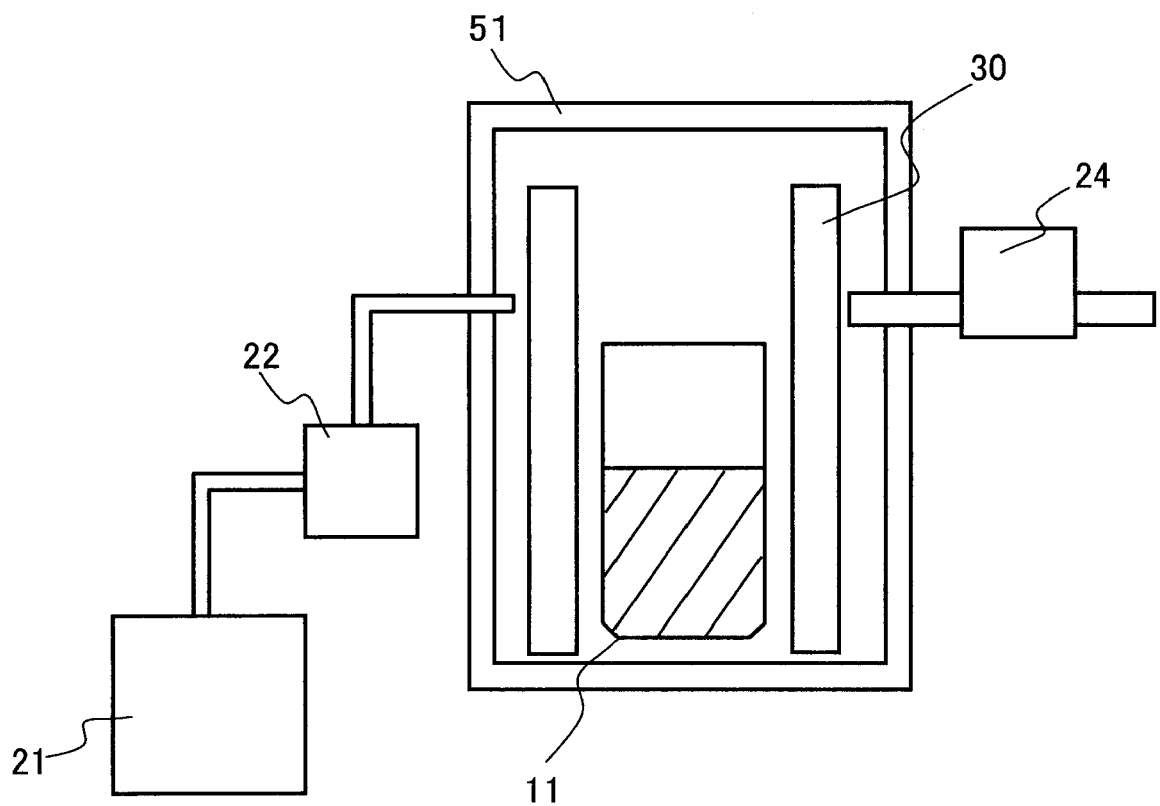
FIG. 7 is a structural view of a producing apparatus used in the embodiment according to the present invention.

In this embodiment, GaN crystals are grown using Ga as a Group III element, a metal Na as alkali metal, and nitrogen ($N_2$) gas as a nitrogen-containing gas. The description is directed to a method for growing the GaN crystals with reference to FIG. 7. FIG. 7 is a structural view showing an example of a configuration of an apparatus used in the producing method according to the present invention. As shown in the figure, this apparatus includes a pressure vessel 51, a gas supplying device 21, a flow amount adjuster 22, and a pressure adjuster 24 as main components. A reaction vessel 11 can be housed in the pressure vessel 51, and a heater 30 is disposed on a side face of the reaction vessel 11. The flow amount adjuster 22 and the pressure adjuster 24 are connected to the pressure vessel 51 via pipes, respectively, and the gas supplying device 21 is connected to the other end of the flow amount adjuster 22 via a pipe.

Figure 2:
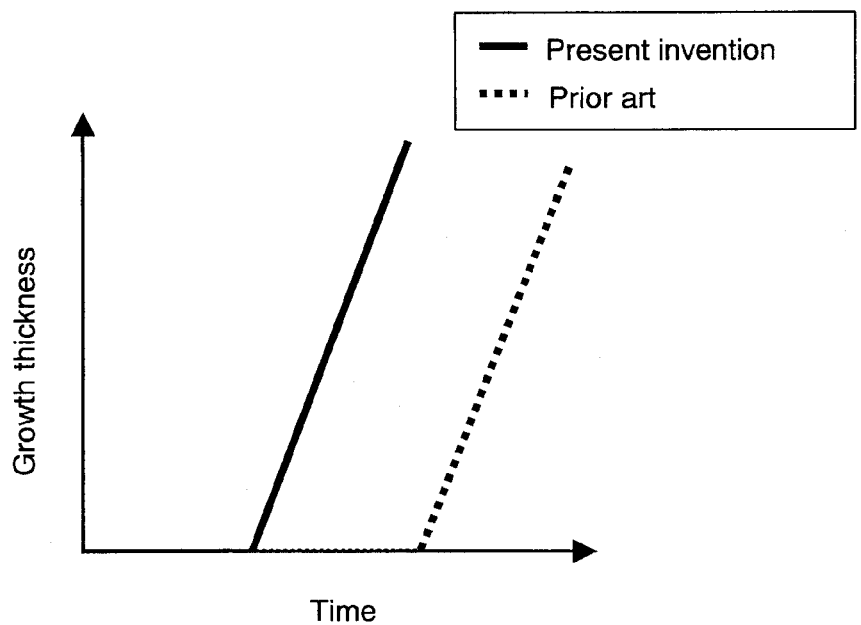
FIG. 2 is a graph showing a relationship between time and growth thickness in the embodiment according to the present invention.

First, Ga and Na are put in the reaction vessel 11. Then, using the heater 30 and the pressure adjuster 24, an ambient temperature and an ambient pressure in the pressure vessel 51 are set to 900° C. to 1050° C. (a temperature higher than in a crystal growth process by, for example, 50° C. to 200° C.) and 40 atm ($40 \times 1.013 \times 10^5$ Pa), respectively, so that nitrogen is allowed to dissolve rapidly in a melt containing Na and Ga to attain a desired nitrogen concentration in the melt (material preparation process). An amount of the nitrogen to be supplied into the pressure vessel 51 is adjusted using the flow amount adjuster 22. After that, in a state where the ambient pressure in the pressure vessel 51 is kept at 40 atm ($40 \times 1.013 \times 10^5$ Pa), the ambient temperature is lowered to 850° C. so that GaN crystals are grown in the melt (crystal growth process). As a result, a length of time from a start of material heating to a start of crystal growth is reduced considerably to, for example, 10 hours to 30 hours, i.e. about one-fifth to a half of a length of time required in the conventional method. FIG. 1 shows an example of a change in ambient temperature over time in this embodiment, and FIG. 2 shows an example of a relationship between growth thickness and time in this embodiment. FIG. 2 also shows a relationship between growth thickness and time in the case where crystals are grown by the conventional method. Further, an apparent growth rate of, for example, 15 μm per hour can be obtained, which is about 1.5 times higher than by the conventional method.

EMBODIMENT 2

Figure 3:
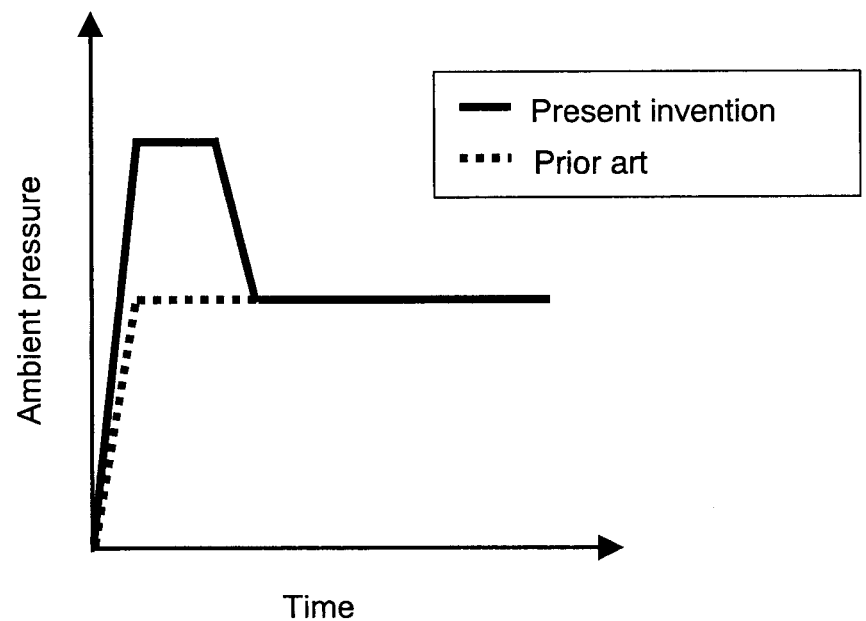
FIG. 3 is a graph showing a relationship between time and ambient pressure in another embodiment according to the present invention.

In this embodiment, GaN crystals are grown using Ga as a Group III element, a metal Na as an alkali metal, and nitrogen ($N_2$) gas as a nitrogen-containing gas. First, an ambient pressure and an ambient temperature are set to 60 atm to 70 atm ($60 \times 1.013 \times 10^5$ Pa to $70 \times 1.013 \times 10^5$ Pa)(a pressure higher than an ambient pressure used during a time of crystal growth by, for example, 20 atm to 30 atm ($20 \times 1.013 \times 10^5$ Pa to $30 \times 1.013 \times 10^5$ Pa)) and 850° C., respectively, and are kept for 1 hour to 5 hours so that nitrogen is allowed to dissolve rapidly in a melt containing Ga and Na to attain a desired nitrogen concentration in the melt (material preparation process). Then, in a state where the ambient temperature is kept at 850° C., the ambient pressure is lowered to 40 atm ($40 \times 1.013 \times 10^5$ Pa) so that GaN crystals are grown in the melt (crystal growth process). As a result, a length of time from a start of material heating to a start of crystal growth is reduced considerably to, for example, 10 hours to 20 hours, i.e. about one-fifth to a half of a length of time required in the conventional method. FIG. 3 shows an example of a change over time in ambient pressure in this embodiment. Further, an apparent growth rate of, for example, 15 μm per hour can be obtained. In the case where in the material preparation process, an ambient pressure and an ambient temperature are set to 60 atm to 70 atm ($20 \times 1.013 \times 10^5$ Pa to $70 \times 1.013 \times 10^5$ Pa) and 850° C., respectively, nitrogen is in a supersaturated state in equilibrium. However, if a nitrogen supply time is as short as, for example, 1 hour to 5 hours, the concentration of a Group-III-element nitride (nitrogen concentration) in a melt is not more than a saturation concentration, and thus crystal growth does not start in the material preparation process.

EMBODIMENT 3

Figure 4:
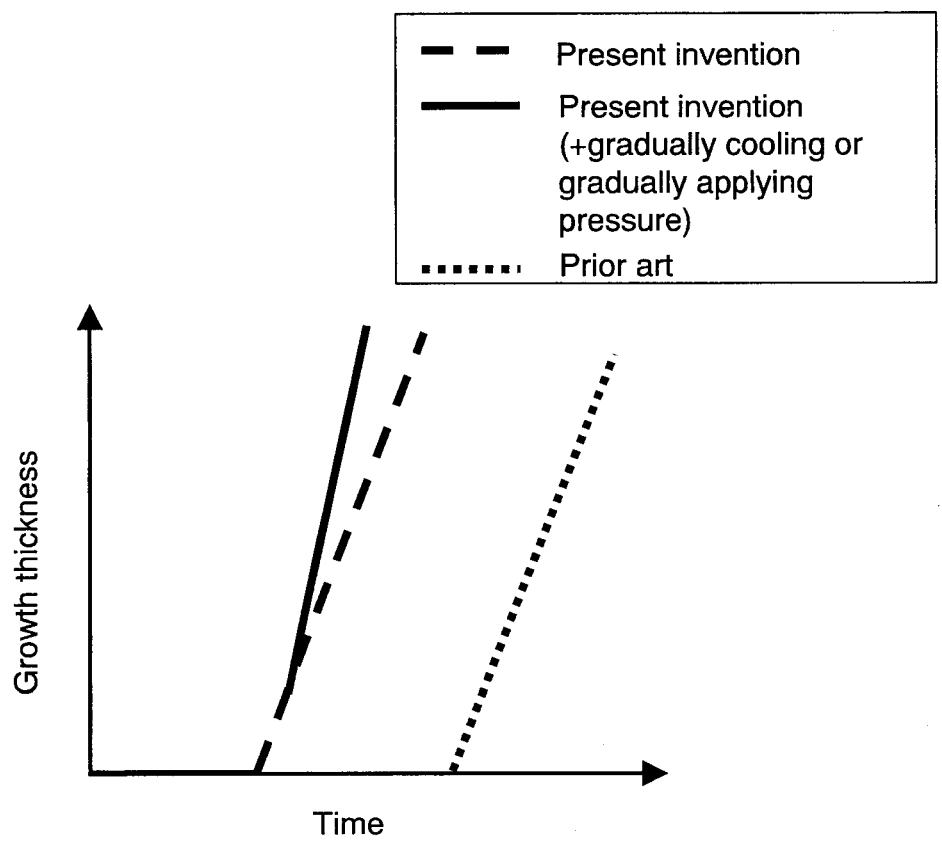
FIG. 4 is a graph showing a relationship between time and growth thickness in still another embodiment according to the present invention.
Figure 5:
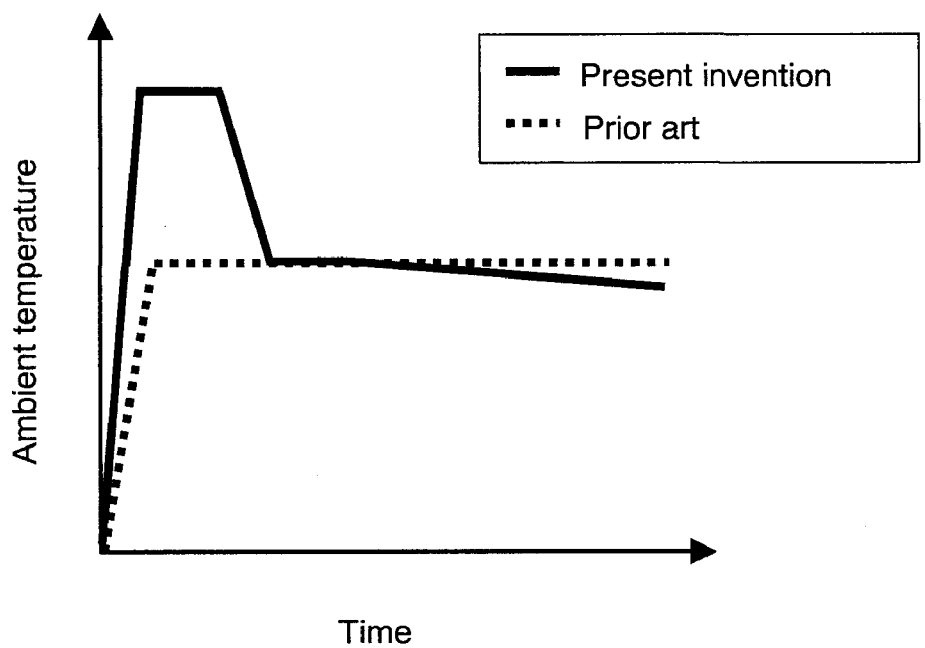
FIG. 5 is a graph showing a relationship between time and ambient temperature in the still another embodiment according to the present invention.

In this embodiment, first, a material preparation process is performed in the same manner as in Embodiment 1, and an ambient temperature is lowered. Then, in a crystal growth process, the ambient temperature further is lowered at a rate of 0.2° C. per hour to 1.5° C. per hour. As a result, a substantial crystal growth rate further is increased and can be, for example, 25 μm per hour. FIG. 5 shows an example of a change over time in ambient temperature in this embodiment, and FIG. 4 shows an example of a relationship between growth thickness and time in this embodiment. FIG. 4 also shows a relationship between growth thickness and time in the case where crystals are grown by the conventional method. An ambient temperature is not particularly required to be lowered linearly with respect to time and may be lowered in a step-wise manner. Further, an ambient temperature may be lowered at a rate gradually increasing in a range of, for example, 0.1° C. per hour to 1.5° C. per hour.

EMBODIMENT 4

Figure 6:
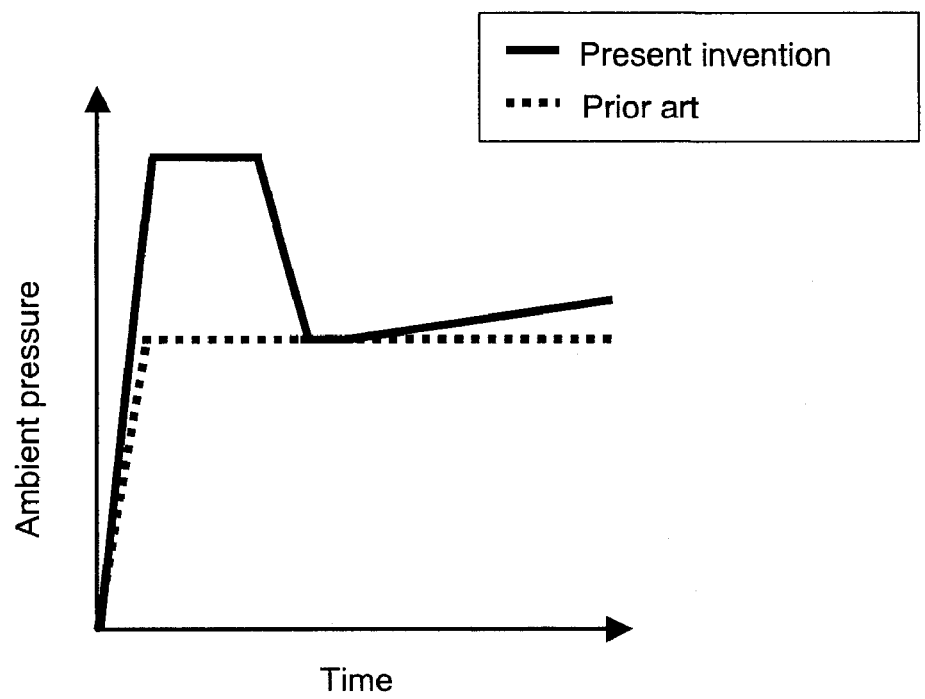
FIG. 6 is a graph showing a relationship between time and ambient pressure in yet still another embodiment according to the present invention.

In this embodiment, first, a material preparation process is performed in the same manner as in Embodiment 2, and an ambient pressure is lowered. Then, in a crystal growth process, the ambient pressure is raised at a rate of 0.05 atm per hour to 0.3 atm per hour ($0.05 \times 1.013 \times 10^5$ Pa per hour to $0.3 \times 1.013 \times 10^5$ Pa per hour). As a result, a substantial crystal growth rate further is increased and can be, for example, 20 μm per hour. FIG. 6 shows an example of a change over time in ambient pressure in this embodiment. An ambient pressure is not particularly required to be raised linearly with respect to a time and may be raised in a step-wise manner. Further, an ambient pressure may be raised at a rate gradually increasing in a range of, for example, 0.05 atm per hour to 0.3 atm per hour ($0.05 \times 1.013 \times 10^5$ Pa per hour to $0.3 \times 1.013 \times 10^5$ Pa per hour).

It is not necessarily required that Embodiments 1 to 4 described above are performed independently. For example, by concurrently raising an ambient temperature and an ambient pressure in a material preparation process, it is possible to allow nitrogen to dissolve in a melt more efficiently.

Furthermore, by concurrently performing the operation of lowering an ambient temperature and the operation of raising an ambient pressure in a crystal growth process, a crystal growth rate can be increased further. Further, an ambient pressure may be raised at a rate increasing gradually in a mid to late stage of crystal growth. For example, in the case of bulk crystals, since the crystals are grown three-dimensionally, by gradually increasing a rate at which an ambient pressure is raised in a mid to late stage of crystal growth as described above, a driving force (the degree of supersaturation) of crystal growth can be made constant, and a growth rate in one crystal axis direction also can be made constant.

EMBODIMENT 5

Figure 8:
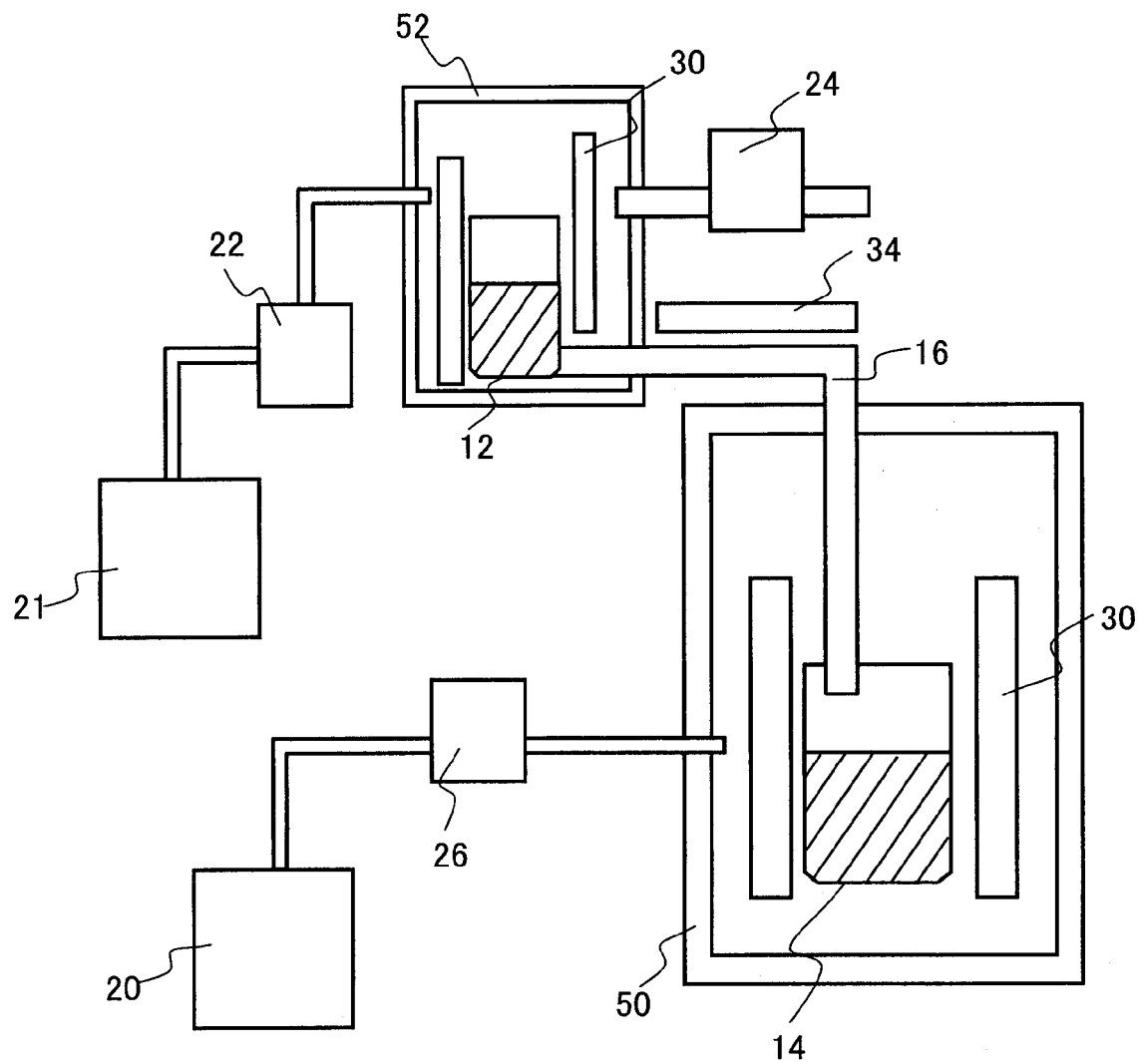
FIG. 8 is a structural view of a producing apparatus used in yet still another embodiment according to the present invention.

The description is directed to an example of a configuration of the producing apparatus according to the present invention with reference to FIG. 8. FIG. 8 shows an example of the producing apparatus according to the present invention. As shown in the figure, this apparatus includes a first pressure vessel 50, a second pressure vessel 52, material conveying means 16, pressure adjusters 24 and 26, a flow amount adjuster 22, and gas supplying devices 21 and 20 as main components. A crystal growth vessel 14 and a material preparation vessel 12 are housed in the first pressure vessel 50 and the second pressure vessel 52, respectively, and a heater 30 is disposed on a side face of each of these vessels (14 and 12). The first pressure vessel 50 and the second pressure vessel 52 are connected to each other by means of the material conveying means 16, and a heater 34 is disposed on the material conveying means 16. The gas supplying device 20 and the pressure adjuster 26 are connected to the first pressure vessel 50 via pipes, respectively, and the gas supplying device 21, the flow amount adjuster 22, and the pressure adjuster 24 are connected to the second pressure vessel 52 via pipes, respectively.

Preferably, as the material conveying means 16, for example, a pipe made of a material that hardly reacts with Na and a Group III element is used. Specific examples of such a pipe include a pipe made of a metal such as W or Ta and a pipe with an inner wall coated with BN, SiC or the like. In the figure, the material preparation vessel and the crystal growth vessels are shown to be separated spatially. However, the configuration of the producing apparatus according to the present invention is not limited thereto, and the material preparation vessel and the crystal growth vessel may be disposed in separate locations in the same growth furnace or may be formed as one unit. With these vessels formed as one unit, a material can be conveyed from the material preparation vessel to the crystal growth vessel even more easily.

With regard to producing of Group-III-element nitride crystals using the producing apparatus shown in FIG. 8, the description is directed to, as an example, a case of using Ga as a Group III element, Na as alkali metal, and nitrogen ($N_2$) gas as a nitrogen-containing gas.

First, desired amounts of Ga and Na are put in the crystal growth vessel 14 beforehand. The nitrogen-containing gas is supplied from the gas supplying device 20 to the pressure adjuster 26 so as to be adjusted to a desired pressure by the pressure adjuster 26 and is introduced in the first pressure vessel 50. Then, an ambient temperature and an ambient pressure in the first pressure vessel 50 are set to a temperature higher than in a crystal growth process, i.e., for example, 900° C. to 1050° C. and 40 atm ($40 \times 1.013 \times 10^5$ Pa), respectively. In this state, Ga and Na are allowed to dissolve so that a melt is prepared, and nitrogen is allowed to dissolve in the melt (material preparation process). At this time, in the melt in the crystal growth vessel 14, while the nitrogen is dissolved, GaN is in an unsaturated state. It also is possible that a melt in which the nitrogen is dissolved sufficiently is formed beforehand in the material preparation vessel 12 and is conveyed to the crystal growth vessel 14 using the material conveying means 16.

Next, the ambient temperature and the ambient pressure in the first pressure vessel 50 are lowered to 800° C. and 30 atm ($30 \times 1.013 \times 10^5$ Pa), respectively, so that crystals are grown in the melt (crystal growth process). Preferably, at this time, an ambient temperature and an ambient pressure in the second pressure vessel 52 are set to 900° C. and 30.1 atm to 31 atm ($30.1 \times 1.013 \times 10^5$ Pa to $31 \times 1.013 \times 10^5$ Pa), respectively. Further, preferably, in order to allow the melt in which the nitrogen is dissolved in the material preparation vessel 12 to be conveyed, the ambient pressure in the second pressure vessel 52 is set so as to be slightly higher than the ambient pressure in the first pressure vessel 50.

Figure 9:
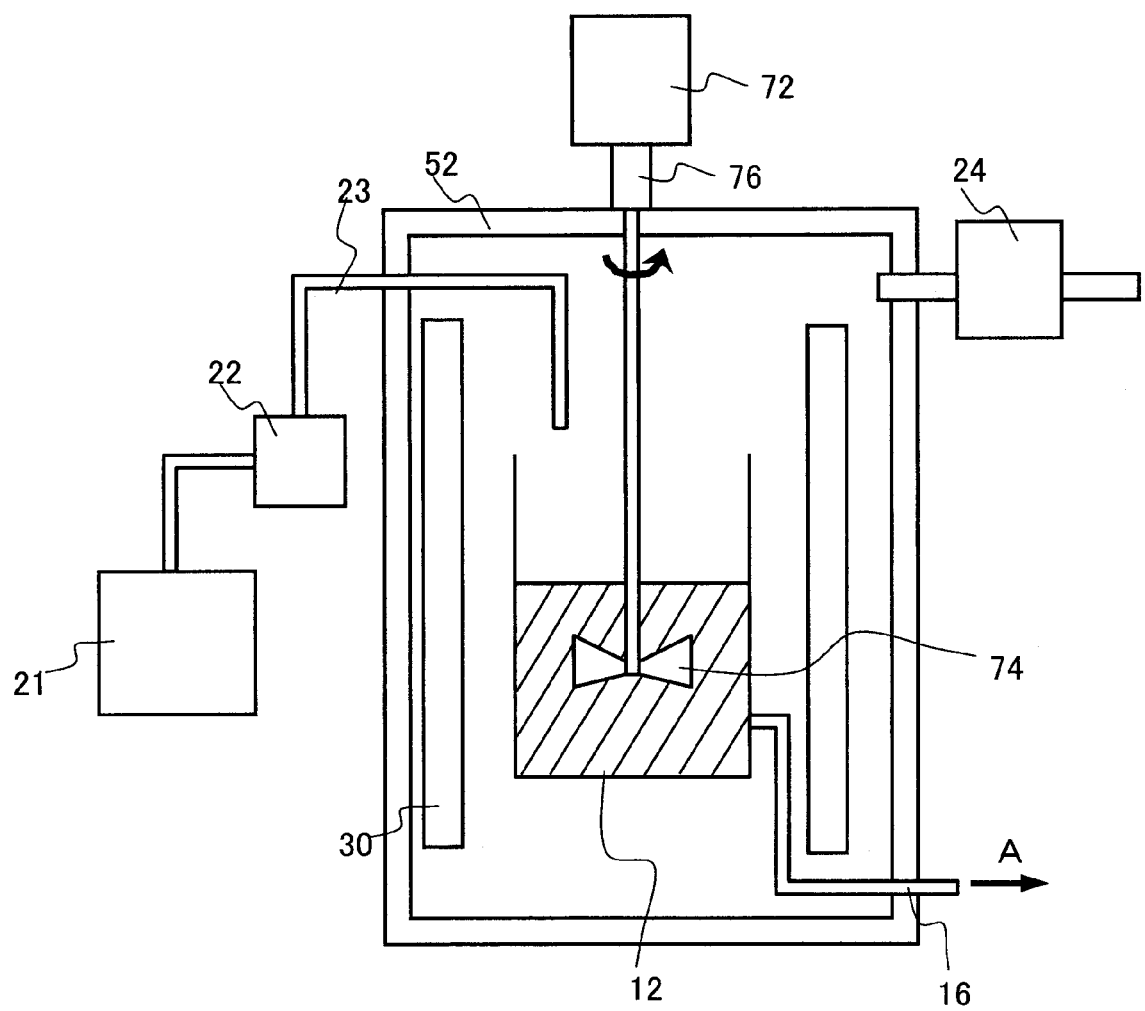
FIG. 9 is a structural view of the producing apparatus used in the yet still another embodiment according to the present invention.

FIG. 9 shows an example of a configuration inside the pressure vessel 52. As shown in the figure, a material preparation vessel 12 is disposed in a second pressure vessel 52, and a heater 30 is disposed on a side face of the material preparation vessel 12. Stirring means 74 is installed so as to penetrate an upper wall face of the pressure vessel 52, and driving means 72 is disposed at one end of the stirring means via rotation introducing means 76. The other end of the stirring means 74 can be placed in a melt in the material preparation vessel 12, and the stirring means 74 is driven via the driving means 72 and the rotation introducing means 76 so that the melt in the material preparation vessel 12 can be stirred. A gas introducing tube 23 and material conveying means 16 are disposed in the material preparation vessel 12, and by the material conveying means 16, the melt in which nitrogen is dissolved (material solution) can be conveyed to a crystal growth vessel (not shown) (in a direction indicated by an arrow A). At one end of the gas introducing tube 23, a gas supplying device 21 is disposed via a flow amount adjuster 22. Nitrogen diffuses from a liquid surface of a melt, and thus the melt tends to have a high nitrogen concentration at the liquid surface (gas-liquid interface). For example, by stirring the material solution in the material preparation vessel by means of the stirring means such as a propeller or the like as described above, a nitrogen concentration in the material solution in the material preparation vessel can be made more uniform. A material for the propeller is not particularly limited as long as it does not dissolve in a material solution, and examples of the material include tungsten, tantalum, alumina, and yttria. In the material preparation vessel, an ambient temperature and an ambient pressure are set so that a saturated or unsaturated state is attained, and thus stirring does not cause heterogeneous nuclei to be generated.

Figure 10:
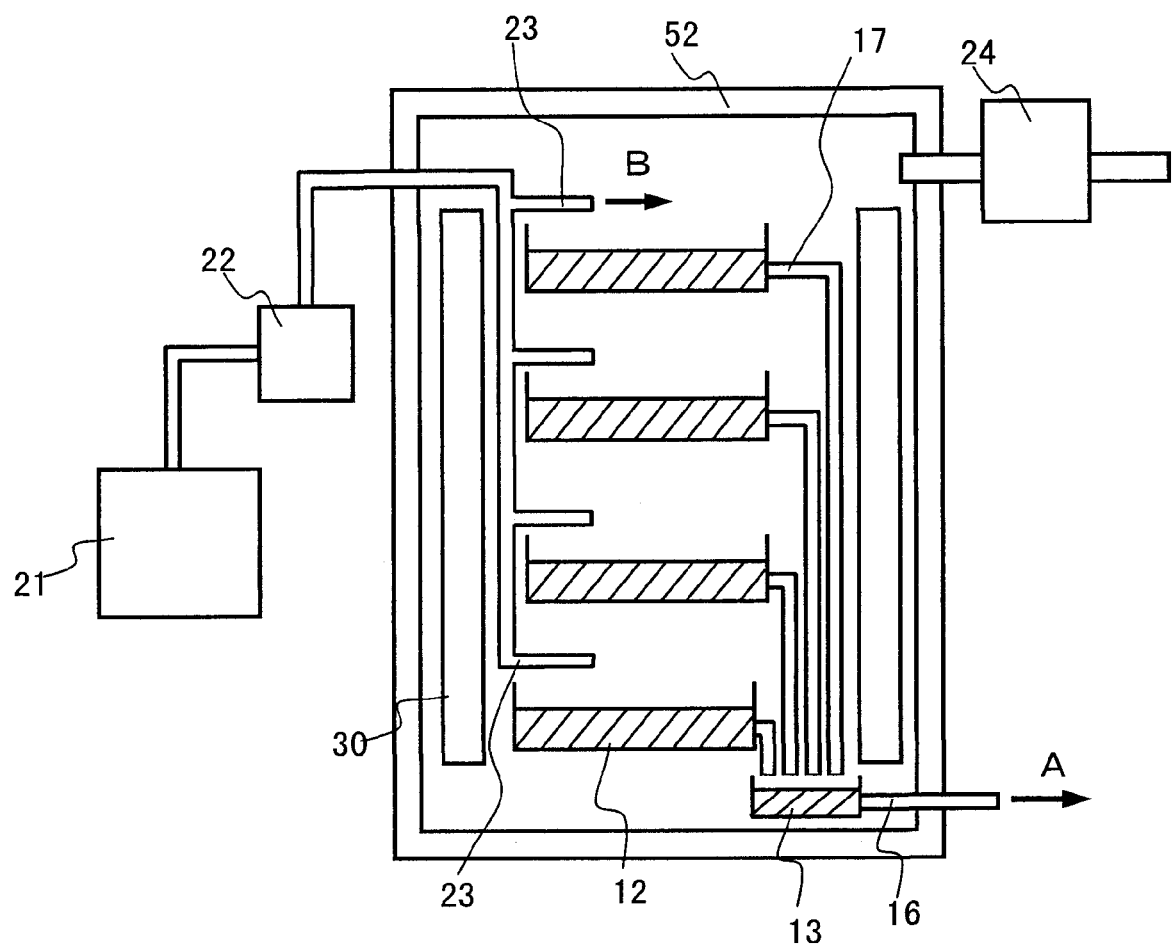
FIG. 10 is a structural view of the producing apparatus used in the yet still another embodiment according to the present invention.

FIG. 10 shows another example of the configuration inside the second pressure vessel 52. As shown in the figure, a plurality of material preparation vessels 12 are disposed in a second pressure vessel 52, and a heater 30 is disposed on side faces of the plurality of material preparation vessels 12. A gas introducing tube 23 and a pipe 17 are provided for each of the material preparation vessels 12, and a material solution reservoir 13 is disposed at the end of the pipes 17. Material conveying means 16 is disposed in the material solution reservoir 13, and by the material conveying means 16, a melt in which nitrogen is dissolved (material solution) can be conveyed to a crystal growth vessel (not shown) (in a direction indicated by an arrow A). At one end of the gas introducing tube 23, a gas supplying device 21 is disposed via a flow amount adjuster 22, and a tip of the other end of the gas introducing tube 23 is disposed so as to be positioned on a liquid surface of the melt in the material preparation vessel 12, and thus a nitrogen-containing gas can be supplied on the liquid surface (in a direction indicated by an arrow B). By disposing the plurality of material preparation vessels 12 as described above, an area of a gas-liquid interface where the melt and the nitrogen-containing gas come into contact with each other can be increased. Moreover, by allowing the nitrogen-containing gas to flow over the liquid surface of the melt, a rate of nitrogen dissolution in the melt can be increased further.

By using the producing apparatuses shown in FIGS. 8, 9 and 10, an apparent growth rate can be increased to, for example, 1.5 to 2 times higher than by the conventional method.

EMBODIMENT 6

Figure 11:
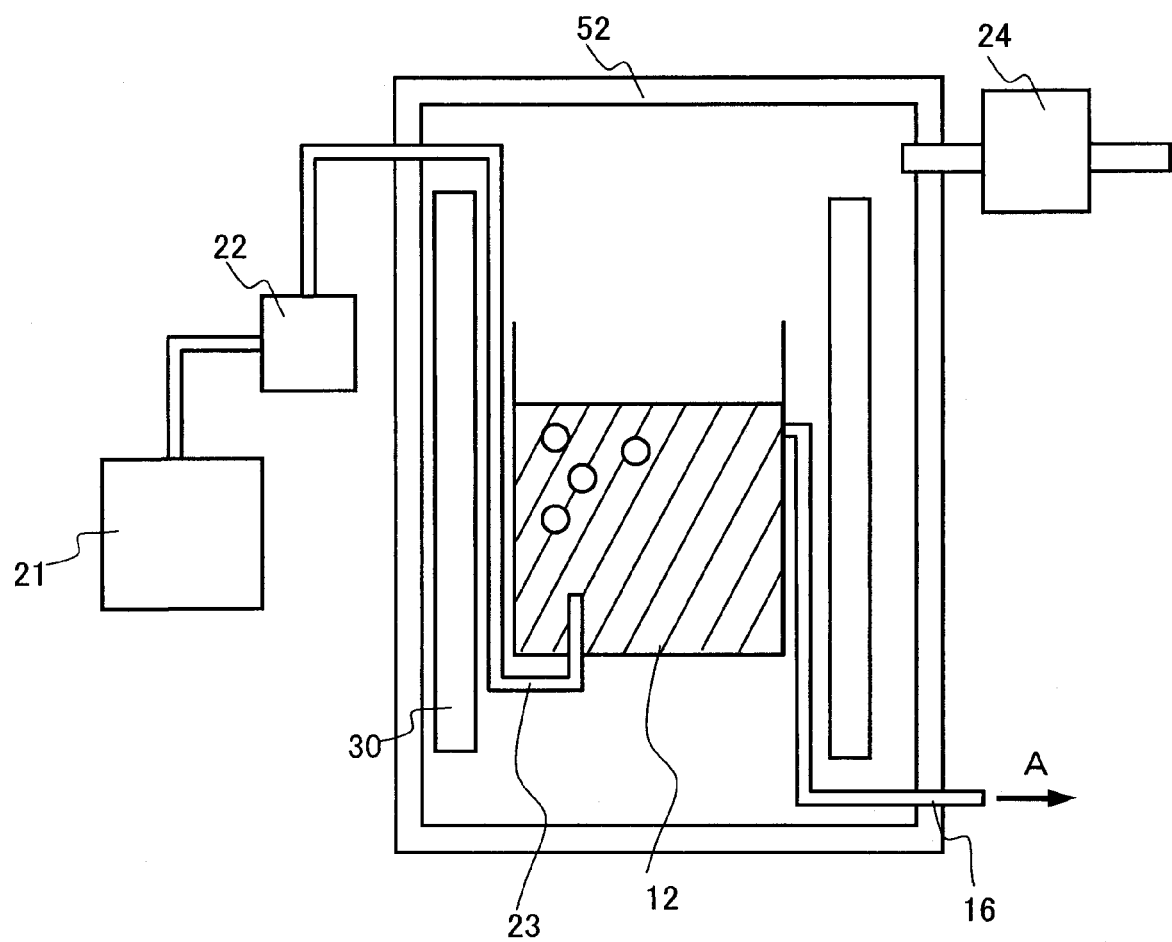
FIG. 11 is a structural view of a producing apparatus used in yet still another embodiment according to the present invention.

The description is directed to still another example of the configuration of the second pressure vessel 52 with reference to FIG. 11. As shown in the figure, a material preparation vessel 12 is disposed in a second pressure vessel 52, and a heater 30 is disposed on a side face of the material preparation vessel 12. A gas introducing tube 23 and material conveying means 16 are disposed in the material preparation vessel 12, and by the material conveying means 16, a melt in which nitrogen is dissolved (material solution) can be conveyed to a crystal growth vessel (not shown) (in a direction indicate by an arrow A). At one end of the gas introducing tube 23, a gas supplying device 21 is disposed via a flow amount adjuster 22, and the other end of the gas introducing tube 23 is disposed so as to penetrate a wall face of the material preparation vessel 12. Through the gas introducing tube 23, a nitrogen-containing gas is introduced into the material preparation vessel 12. The melt (material solution) can be conveyed from the material preparation vessel to the crystal growth vessel utilizing, for example, a pressure difference between the second pressure vessel and a first pressure vessel.

By disposing the gas introducing tube 23 in the above-described manner, the nitrogen-containing gas can be bubbled in the melt in the material preparation vessel 12, and it is possible to allow the nitrogen to dissolve in the melt more rapidly. This allows crystal growth to start earlier. According to the configuration of this apparatus, in the case where GaN crystals are grown under the same conditions as those used in Embodiment 5, a length of time up to a start of crystal growth can be reduced to, for example, less than 3 hours. As a result of this, an apparent crystal growth rate can be increased to, for example, about 2 to 2.5 times higher compared with the conventional case. Similarly to Embodiment 5, in the material preparation vessel 12, an unsaturated state is kept, and thus nitrogen dissolution can be realized swiftly. Further, generation of microcrystals such as heterogeneous nuclei does not occur in the material preparation vessel 12.

Figure 12:
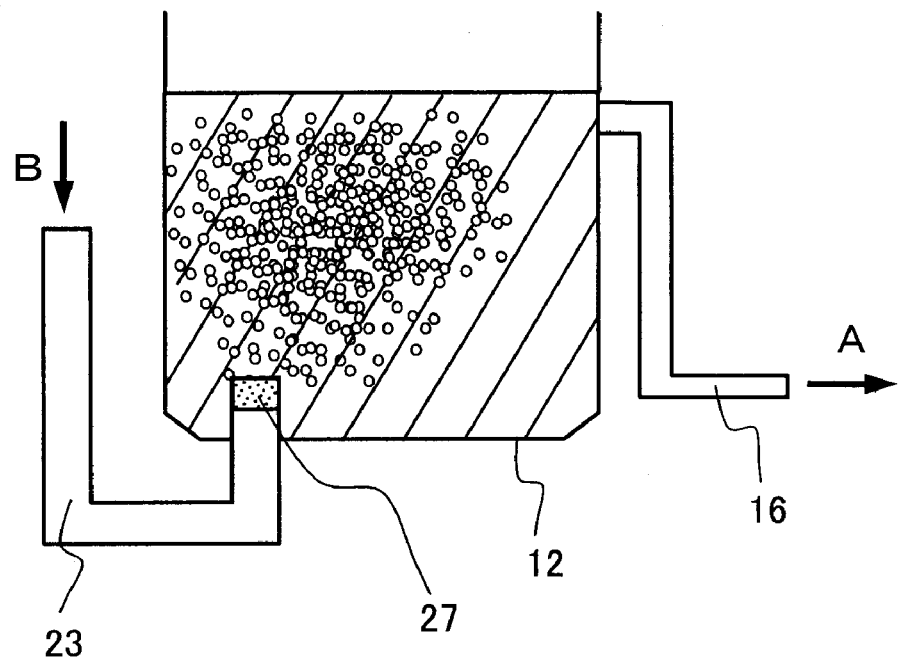
FIG. 12 is a structural view of the producing apparatus used in the yet still another embodiment according to the present invention.

From the viewpoint of improving efficiency of nitrogen dissolution in the melt, preferably, when bubbling the nitrogen-containing gas, bubbles are allowed to stay in the melt as long as possible. This can be achieved by, for example, a method in which a cap is disposed at a tip of the gas introducing tube so that bubbles of a reduced size are obtained. The description is directed to this method with reference to FIG. 12. FIG. 12 is a structural view showing an example of a configuration of a peripheral portion of the material preparation vessel 12, in which the same reference characters denote the same portions as in FIG. 11. As shown in the figure, in a material preparation vessel 12, a gas introducing tube 23 and material conveying means 16 are disposed so as to penetrate wall faces, respectively. A cap 27 is disposed at a tip of the gas introducing tube 23, and a nitrogen-containing gas is supplied into a melt via the cap 27 disposed at the tip of the gas introducing tube 23 so that the size of bubbles can be controlled (reduced, for example). By reducing the size of bubbles, a surface where the melt and the nitrogen-containing gas come into contact with each other (an area of a gas-liquid interface) can be increased. Moreover, by reducing the size of bubbles, thanks to the viscosity of the melt, the influence of the Brownian movement and the like, the bubbles can stay in the melt for a longer time. As a result of these, the efficiency of nitrogen dissolution in the melt can be improved, and thus an amount of nitrogen dissolved in the melt can be maximized while a gas flow amount is minimized. Therefore, a gas flow amount can be minimized even in the case of allowing the same amount of nitrogen to dissolve in the melt, and thus evaporation of alkali metal and alkaline-earth metal in the melt can be reduced further. Moreover, by reducing a gas flow amount, convection becomes relatively milder, which also has an effect that even when in a material preparation process, Group-III-element nitride crystals in the melt is brought to a somewhat supersaturated state, heterogeneous nuclei hardly are generated in the melt.

The size of bubbles can be adjusted by means of, for example, a pore diameter of the cap 27 or a flow amount of a gas to be supplied. In the case of reducing the size of bubbles, for example, a cap having a small pore diameter could be used. For example, in the case where the nitrogen-containing gas is supplied with the pore diameter and a flow amount set to several µm to several 100 µm and 50 cc per min to 5,000 cc per min, respectively, bubbles having a diameter of several pm to several 100 µm can be supplied in the melt. Examples of the cap 27 include metal caps originating from porous ceramic such as porous alumina, tungsten, tantalum and the like.

Figure 13:
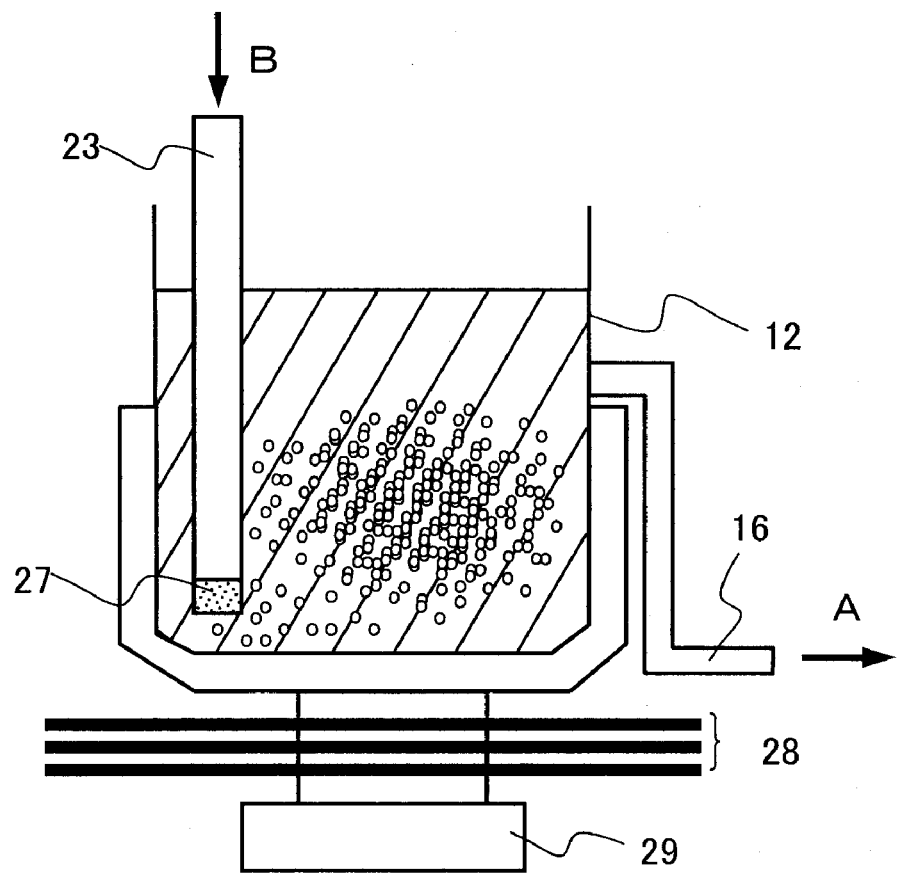
FIG. 13 is a structural view of the producing apparatus used in the yet still another embodiment according to the present invention.

Furthermore, it is possible to allow bubbles to stay in a melt as long as possible by, in addition to or in place of the above-described method in which a cap is disposed at the tip of the gas introducing tube, a method utilizing ultrasonic waves. The description is directed to this method with reference to FIG. 13. FIG. 13 is a structural view showing another example of the configuration of the peripheral portion of the material preparation vessel, in which the same reference characters denote the same portions as in FIG. 12. As shown in the figure, material conveying means 16 is disposed so as to penetrate a right side wall face of a material preparation vessel 12, and an ultrasonic wave generating device 29 is disposed below the material preparation vessel 12 via heat blocking plates 28. A gas introducing tube 23 is disposed from an upper direction of the material preparation vessel 12 so that a tip thereof is positioned at a bottom face of the material preparation vessel 12, and a cap 27 is disposed at a tip of the gas introducing tube 23. By applying ultrasonic waves to a melt in the material preparation vessel 12 using the ultrasonic wave generating device 29, bubbles supplied from the gas introducing tube 23 are fixed, for example, at a position of a node of the ultrasonic waves. As a result, it is possible to allow the bubbles to stay in the melt for a still longer time, and thus the efficiency of nitrogen dissolution further can be improved.

EMBODIMENT 7

Figure 14:
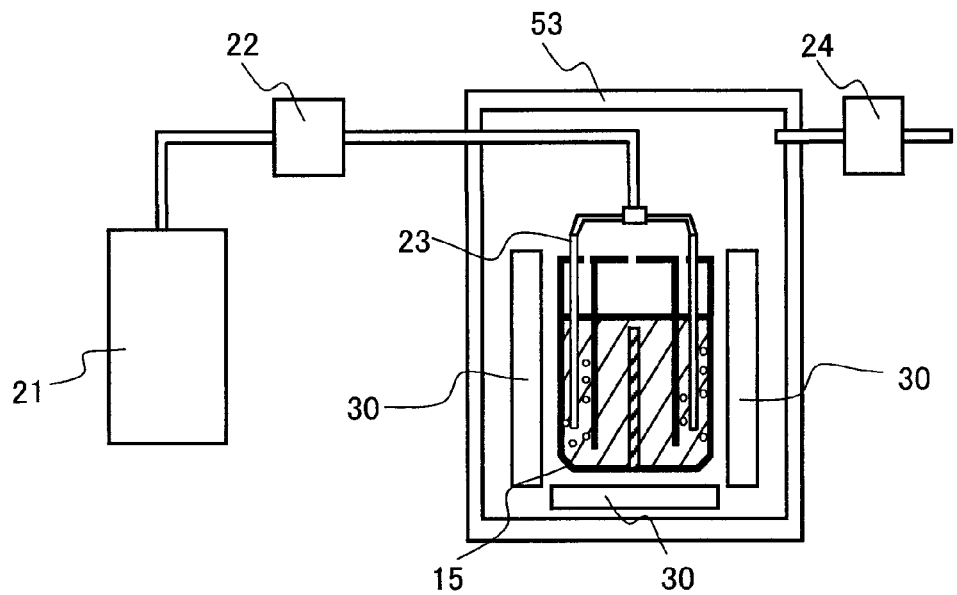
FIG. 14 is a structural view of a producing apparatus used in yet still another embodiment according to the present invention.

This embodiment describes still another example of the configuration of the producing apparatus according to the present invention with reference to FIG. 14. This example has a duplexed structure in which a material preparation vessel and a crystal growth vessel are formed as one unit, and a single vessel is separated into a material preparation vessel portion and a crystal growth vessel portion. In the figure, the same reference characters denote the same portions as in FIG. 8. As shown in the figure, this apparatus includes a pressure vessel 53, a pressure adjuster 24, a flow amount adjuster 22, and a gas supplying device 21 as main components. A material preparation vessel-cum-crystal growth vessel 15 can be housed in the pressure vessel 53, and heaters 30 are disposed on side and bottom faces of the vessel 15. The flow amount adjuster 22 and the pressure adjuster 24 are connected to the pressure vessel 53 via pipes, respectively, and the gas supplying device 21 is connected to the flow amount adjuster 22 via a pipe.

Figure 15:
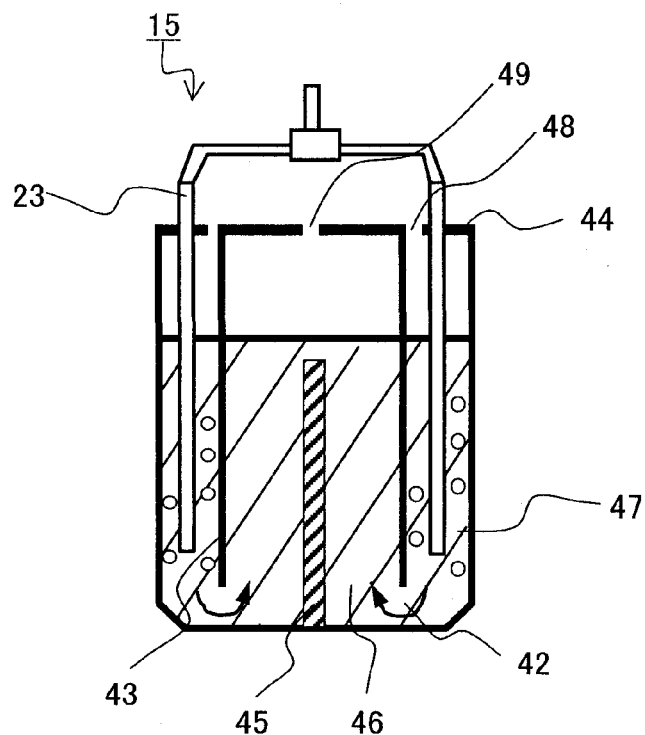
FIG. 15 is a structural view of the producing apparatus used in the yet still another embodiment according to the present invention.

FIG. 15 shows an example of a configuration of the material preparation vessel-cum-crystal growth vessel 15. As shown in the figure, an upper portion of a material preparation vessel-cum-crystal growth vessel 15 can be closed by means of a lid 44. An inner portion of the material preparation vessel-cum-crystal growth vessel 15 has a duplexed structure, i.e. is separated into a crystal growth vessel portion 46 and a material preparation vessel portion 47 by means of a partition 43, and seed crystals 45 can be disposed in the crystal growth vessel portion 46. In a lower portion of the partition 43 (in the neighborhood of a bottom face of the material preparation vessel-cum-crystal growth vessel 16), a hole 42 is formed so that a melt in the material preparation vessel portion 47 can be conveyed to the crystal growth vessel portion 46. In the material preparation vessel portion 47, a gas introducing tube 23 is disposed so that a tip thereof is positioned at a lower portion of the material preparation vessel portion 47 (in the neighborhood of the bottom face of the material preparation vessel-cum-crystal growth vessel 16). Further, holes 48 and 49 are formed in the lid 44 so as to correspond to the material preparation vessel portion 47 and the crystal growth vessel portion 46, respectively, and a nitrogen-containing gas or the like in the material preparation vessel-cum-crystal growth vessel 15 can be ejected from the hole 48. The hole 49 formed in a portion of the lid 44 that corresponds to the crystal growth vessel portion 46 is intended to make an atmospheric pressure in the pressure vessel 53 and a pressure in the crystal growth vessel portion 46 uniform.

The following describes producing of Group-III-element nitride crystals using the apparatus shown in FIGS. 14 and 15. A Group III element and at least one of alkali metal and alkaline-earth metal are put in the material preparation vessel-cum-crystal growth vessel 15 beforehand. Using the heaters 30 and the pressure adjuster 24, the material preparation vessel-cum-crystal growth vessel 15 is subjected to pressurizing and heating so that a melt containing the Group III element and the at least one of alkali metal and alkaline-earth metal is prepared. At this time, a temperature in the material preparation vessel portion 47 is set so as to be higher than a temperature in the crystal growth vessel portion 46 by, for example, several to several 10° C. Next, a nitrogen-containing gas is bubbled by means of the gas introducing tube 23 so that nitrogen is allowed to dissolve in the melt in the material preparation vessel portion 47, and thus a material solution is prepared. Due to reasons such as an increase in nitrogen concentration in the melt in the material preparation vessel portion 47 and as a result of performing the bubbling, the melt (material solution) containing the nitrogen in the material preparation vessel portion 47 diffuses to the crystal growth vessel portion 46 through the hole 42. In this example, the hole 42 serves as the material conveying means. Since the temperature in the crystal growth vessel portion 46 is lower than the temperature in the material preparation vessel portion 47 as described above, the melt containing the nitrogen is brought to a supersaturated state, so that crystal growth starts on a surface of the seed crystals 45. As described above, with the material preparation vessel portion 47 and the crystal growth vessel portion 46 formed as one unit, a compact apparatus can be formed, and a melt can be conveyed extremely easily. Further, by allowing a melt (material solution) containing a high concentration of nitrogen to be conveyed from a lower side of the crystal growth vessel portion 46, a nitrogen concentration at, for example, an interface between the melt and the partition 43 or a liquid surface of the melt can be lowered, and as a result, the generation of heterogeneous nuclei can be reduced further. In this embodiment, the seed crystals 45 are disposed in a standing condition with no limitation thereto. The seed crystals 45 may be disposed horizontally on a bottom face of the crystal growth vessel portion 46 or may be disposed diagonally.

The following describes the Group-III-element nitride semiconductor element according to the present invention by way of an example.

EXAMPLE 1

Figure 16:
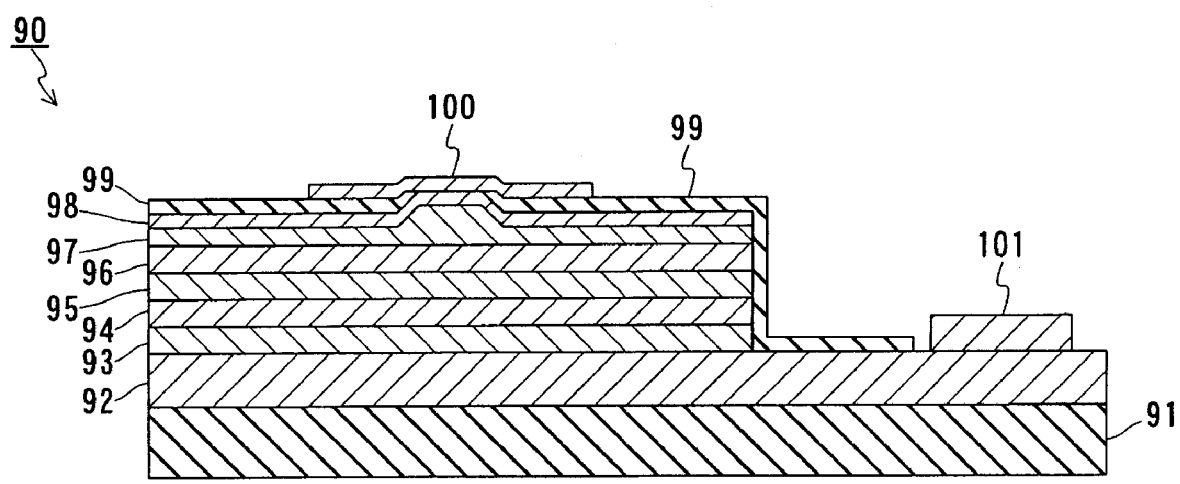
FIG. 16 is a cross-sectional view of a Group-III-element nitride semiconductor element in an example according to the present invention.

A semiconductor laser was produced using crystals produced by the method according to the present invention as a substrate. FIG. 16 shows a structure of a semiconductor laser 90.

First, on GaN crystals as a substrate 91 that were produced in the same manner as in Embodiment 1 described above, a n-type GaN layer 92 was formed, to which Si was added as a dopant so that a carrier concentration of $5 \times 10^{18}$ cm$^{-3}$ or lower (for example, $0.7 \times 10^{18}$ cm$^{-3}$) was obtained. In GaN-based crystals (crystals containing Ga and N), with Si added as a dopant, holes present in Ga tend to increase. These holes present in Ga diffuse easily and thus exert an adverse effect on the lifetime or the like of a device produced on the holes. With this in view, an amount of the dopant was controlled so that a carrier concentration of $5 \times 10^{18}$ cm$^{-3}$ or lower was obtained, thereby manufacturing a highly reliable device.

Next, a cladding layer 93 of n-type $Al_{0.07}Ga_{0.93}N$ and a light guiding layer 94 of n-type GaN were formed on the n-type GaN layer 92. Then, a multiple quantum well (MQW) composed of a well layer (having a thickness of about 3 nm) made of $Ga_{0.8}In_{0.2}N$ and a barrier layer (having a thickness of 6 nm) made of GaN was formed as an active layer 95. Thereafter, a light guiding layer 96 of p-type GaN, a cladding layer 97 of p-type $Al_{0.07}Ga_{0.93}N$, and a contact layer 98 of p-type GaN were formed. These layers could be formed by a known method (for example, the MOCVD method). The semiconductor laser 90 is of a double-hetero junction type. The energy gap of the well layer containing indium in the MQW active layer is smaller than those of the n-type and p-type cladding layers containing aluminum. On the other hand, the highest optical refractive index was obtained in the well layer of the active layer 95, while the light guiding layers and the cladding layers had optical refractive indices that decreased in this order.

An about 2-µm wide insulating film 99 forming a current injection region was formed on an upper portion of the contact layer 98. A ridge portion to serve as a current constriction portion was formed in an upper portion of the p-type cladding layer 97 and the p-type contact layer 98. A p-side electrode 100 that was in ohmic contact with the contact layer 98 was formed on an upper side of the p-type contact layer 98. An n-side electrode 101 that was in ohmic contact with the n-type GaN substrate 91 was formed on n-type GaN substrate 91.

With respect to the semiconductor laser manufactured by the above-described method, a device evaluation was performed. As a result, when a predetermined forward voltage was applied between the p-side electrode and the n-side electrode of the obtained semiconductor laser, positive holes and electrons were injected into the MQW active layer from the pide electrode and the n-side electrode, respectively. The positive holes and electrons thus injected were recombined with each other in the MQW active layer to produce optical gain, so that the semiconductor laser generated oscillation at an emission wavelength of 404 nm. GaN crystals obtained by the producing method according to the present invention have a low defect density and thus are highly reliable, thereby allowing a light-emitting element that has a high optical output while causing no degradation to be realized.

In the present example, a semiconductor element was formed using a GaN single crystal substrate. In this connection, it is desirable to provide a substrate that has low absorptivity with respect to a wavelength used in an optical device to be produced on the substrate. Therefore, preferably, $Al_xGa_{1-x}N(0 \leq x \leq 1)$ single crystals that contain a large amount of Al and have low absorptivity with respect to light with a wavelength in a short wavelength region are formed to be used as a substrate for a semiconductor laser or a light-emitting diode handling light within an ultraviolet region. In the present invention, by using another Group III element in place of part of Ga, such Group III element nitride crystals also can be formed.

INDUSTRIAL APPLICABILITY

As described in the foregoing discussion, the present invention can provide a high-quality substrate that achieves reduction in crystal growth time at low cost. Further, a GaN single crystal substrate that can be obtained by the producing method and producing apparatus according to the present invention has a low dislocation density compared with a substrate produced by vapor deposition (for example, HVPE) or the like and thus is extremely advantageous in achieving a high output and a long life of a semiconductor laser.

The invention claimed is:

1. A method for producing Group-III-element nitride crystals, comprising:
    a material preparation process of preparing a material solution by dissolving nitrogen in a melt containing a Group III element and at least one metal selected from the group consisting of alkali metal and alkaline-earth metal placed in a material preparation vessel,
    wherein the material preparation process is performed under an atmosphere of a nitrogen-containing gas,
    at least one of an ambient temperature and ambient pressure is higher than that to be applied in a crystal growth process so that the nitrogen is allowed to dissolve in the melt, and
    the ambient pressure in the material preparation process is 2 atm to 100 atm ($2 \times 1.013 \times 10^5$ Pa to $100 \times 1.013 \times 10^5$ Pa);
    a material solution conveying process of conveying the material solution prepared in the material preparation process from the material preparation vessel to a crystal growth vessel; and
    a crystal growth process of pressurizing and heating the material solution containing the Group III element, the nitrogen, and the at least one of alkali metal and alkaline-earth metal under an atmosphere of a nitrogen-containing gas placed in the crystal growth vessel so that the nitrogen and the Group III element in the material solution react with each other and grow crystals.

2. The method according to claim 1,
    wherein after a shift from the material preparation process to the crystal growth process, the ambient temperature that has been decreased to be lower than the ambient temperature in the material preparation process is then further lowered gradually to a predetermined temperature for the crystal growth.

3. The method according to claim 2,
    wherein the ambient temperature is lowered at a rate in a range of 0.05° C. per hour to 30° C. per hour.

4. The method according to claim 1,
    wherein after a shift from the material preparation process to the crystal growth process, the ambient pressure that has been decreased to be lower than the ambient pressure in the material preparation process is then raised gradually to a predetermined pressure for the crystal growth.

5. The method according to claim 4,
    wherein the ambient pressure is raised at a rate in a range of 0.01 atm per hour to 0.3 atm per hour ($0.01 \times 1.013 \times 10^5$ Pa per hour to $0.3 \times 1.013 \times 10^5$ Pa per hour).

6. The method according to claim 1,
    wherein in the material preparation process, the ambient temperature is in a range of 800° C. to 1100° C. and the ambient pressure is in a range of 2 atm to 100 atm ($2 \times 1.013 \times 10^5$ Pa to $100 \times 1.013 \times 10^5$ Pa), and
    in the crystal growth process, the ambient temperature is in a range of 600° C. to 1000° C., and the ambient pressure is in a range of 2 atm to 100 atm ($2 \times 1013 \times 10^5$ Pa to $100 \times 1.013 \times 10^5$ Pa).

7. The method according to claim 1,
    wherein in the material preparation process, the material solution is brought to a state where the Group-III-element nitride crystals are unsaturated.

8. The method according to claim 1,
    wherein in the material preparation process, the nitrogen-containing gas flows over a liquid surface of the melt.

9. The method according to claim 1,
    wherein in the material preparation process, the nitrogen-containing gas is bubbled in the melt.

10. The method according to claim 1,
    wherein in the material preparation process, the nitrogen-containing gas is bubbled in the melt to form microbubbles.

11. The method according to claim 9,
    wherein in the material preparation process, ultrasonic waves are applied to the melt.

12. The method according to claim 1,
    wherein the material preparation process is further performed at least one of during and after the crystal growth process.

13. The method according to claim 1,
    wherein the material preparation vessel and the crystal growth vessel are formed as one unit.

14. The method according to claim 1,
    wherein the Group III element is at least one selected from the group consisting of Al, Ga, and In.

15. The method according to claim 1,
    wherein the Group III element is Ga, and the Group-III-element nitride crystals are GaN crystals.

16. The method according to claim 1,
    wherein the ambient pressure used in the material preparation process is 10 atm to 100 atm ($10 \times 1.013 \times 10^5$ Pa to $100 \times 1.013 \times 10^5$ Pa).

* * * * *